United States Patent [19]

Kondo

[11] Patent Number: 5,652,515
[45] Date of Patent: Jul. 29, 1997

[54] METHOD AND APPARATUS FOR HIGH SPEED THREE DIMENSIONAL NUCLEAR MAGNETIC RESONANCE IMAGING

[75] Inventor: Masafumi Kondo, Kanagawa-ken, Japan

[73] Assignee: Kabushiki Kaisha Toshiba, Kawasaki, Japan

[21] Appl. No.: 522,954

[22] Filed: Sep. 1, 1995

[30] Foreign Application Priority Data

Sep. 2, 1994 [JP] Japan ............................ 6-209670

[51] Int. Cl.$^6$ ............................ G01R 33/54; A61B 5/055
[52] U.S. Cl. ................................. 324/309; 128/653.2
[58] Field of Search ............................ 324/300, 307, 324/309, 310, 311, 312, 313, 314, 318, 322; 128/653.2, 653.3, 653.5

[56] References Cited

U.S. PATENT DOCUMENTS 5,497,773  3/1996  Kuhara et al. ..................... 324/318

FOREIGN PATENT DOCUMENTS 2-131746  5/1990  Japan .

OTHER PUBLICATIONS

Ogawa et al., "Oxygenation–Sensitive Contrast in Magnetic Resonance Image of Rodent Brain at High Magnetic Fields", Magnetic Resonance in Medicine 14, 68–78, 1990.
Weisskoff et al., "MRI Susceptometry: Image–Based Measurement of Absolute Susceptibility of MR Contrast Agents and Human Blood", Magnetic Resonance in Medicine 24, 375–383, 1992.

*Primary Examiner*—Sandra L. O'Shea
*Assistant Examiner*—Roger Phillips
*Attorney, Agent, or Firm*—Foley & Lardner

[57] ABSTRACT

A nuclear magnetic resonance imaging scheme suitable for three dimensional physiological function imaging such as brain function imaging. In this scheme, the pulse sequence is controlled to realize a three dimensional imaging sequence with a division scan in at least one of a first encoding direction and a second encoding direction. In other words, the pulse sequence is controlled to realize a three dimensional imaging sequence with first encoding gradient field pulses and second encoding gradient field pulses for defining regular sampling pitches in first and second encoding directions, where at least one of the first encoding gradient field pulses and the second encoding gradient field pulses has a lead-in pulse in regularly changing magnitude for each spin excitation.

20 Claims, 25 Drawing Sheets

FIG. 4
PRIOR ART

| CASE | 1A | 1B | 1C |
|---|---|---|---|
| Gr | 5.8mT/m | 13.5mT/m | 40mT/m |
| $\Delta Tsw,r$ | 0.1ms | 0.1ms | 0.1ms |
| Ms | 32 | 32 | 32 |
| DAT | 100ms | 50ms | 25ms |
| TR | $\infty$ | $\infty$ | $\infty$ |
| $\alpha$ | 90 | 90 | 90 |
| TS | 100ms | 75ms | 62.5ms |
| Tscan | 3.2s | 2.4s | 2s |
| RELATIVE IMAGE S/N | 2.63 | 1.72 | 1.0 (REFERENCE) |
| IMAGE DISTORTION (FIELD INHOMOGENEITY) | LARGE | MEDIUM | SMALL |
| T2 IMAGE BLURRING | LARGE | MEDIUM | SMALL |
| N/2 ARTIFACT | LARGE | MEDIUM | SMALL |

FIG. 6
PRIOR ART

| CASE | 2A | 2B | 2C |
|---|---|---|---|
| Gr | 5.8mT/m | 13.5mT/m | 40mT/m |
| $\Delta Tsw,r$ | 0.1ms | 0.1ms | 0.1ms |
| $Ne,2$ | 32 | 32 | 32 |
| DAT | 100ms | 50ms | 25ms |
| TR=TS | 100ms | 75ms | 62.5ms |
| $\alpha e$ | 25.7 | 22.4 | 20.5 |
| Tscan | 3.2s | 2.4s | 2s |
| RELATIVE IMAGE S/N | 3.75 | 2.11 | 1.13 |
| IMAGE DISTORTION (FIELD INHOMOGENEITY) | LARGE | MEDIUM | SMALL |
| T2 IMAGE BLURRING | LARGE | MEDIUM | SMALL |
| N/2 ARTIFACT | LARGE | MEDIUM | SMALL |

FIG. 9
PRIOR ART

| CASE | 3C |
|---|---|
| Gr | 40mT/m |
| $\Delta Tsw,r$ | 0.1ms |
| Necho | 256 |
| Ne,2 | 4 (FOR $\Delta x_{e,2}$ =3mm, $X_{e,2}$=12mm) |
| DAT | 100ms |
| TR | $\infty$ |
| $\alpha$ | 90 |
| Tscan | 100ms |
| RELATIVE IMAGE S/N | 2.0 |
| IMAGE DISTORTION (FIELD INHOMOGENEITY) | MEDIUM (ESPECIALLY IN ENCODING DIRECTION) |
| T2 IMAGE BLURRING | MEDIUM |
| ARTIFACT DUE TO T2 DATA DISCONTINUITY | LARGE |
| N/2 ARTIFACT | SMALL |

FIG. 13

| CASE | 4B | 4C |
|---|---|---|
| Gr | 13.5mT/m | 40mT/m |
| $\Delta$Tsw,r | 0.1ms | 0.1ms |
| DAT(2D) | 50ms | 25ms |
| DAT | 100ms | 100ms |
| Necho | 128 | 256 |
| ND,e | 1 | 1 |
| ND,e,2 | 16 | 8 |
| ND,e,2/ex | 2 | 4 |
| Ne,2 | 32 | 32 |
| TR=TS | 100ms | 100ms |
| $\alpha$ e | 25.7 | 25.7 |
| Tscan | 1.6s | 0.8s |
| RELATIVE IMAGE S/N | 2.47 | 1.44 |

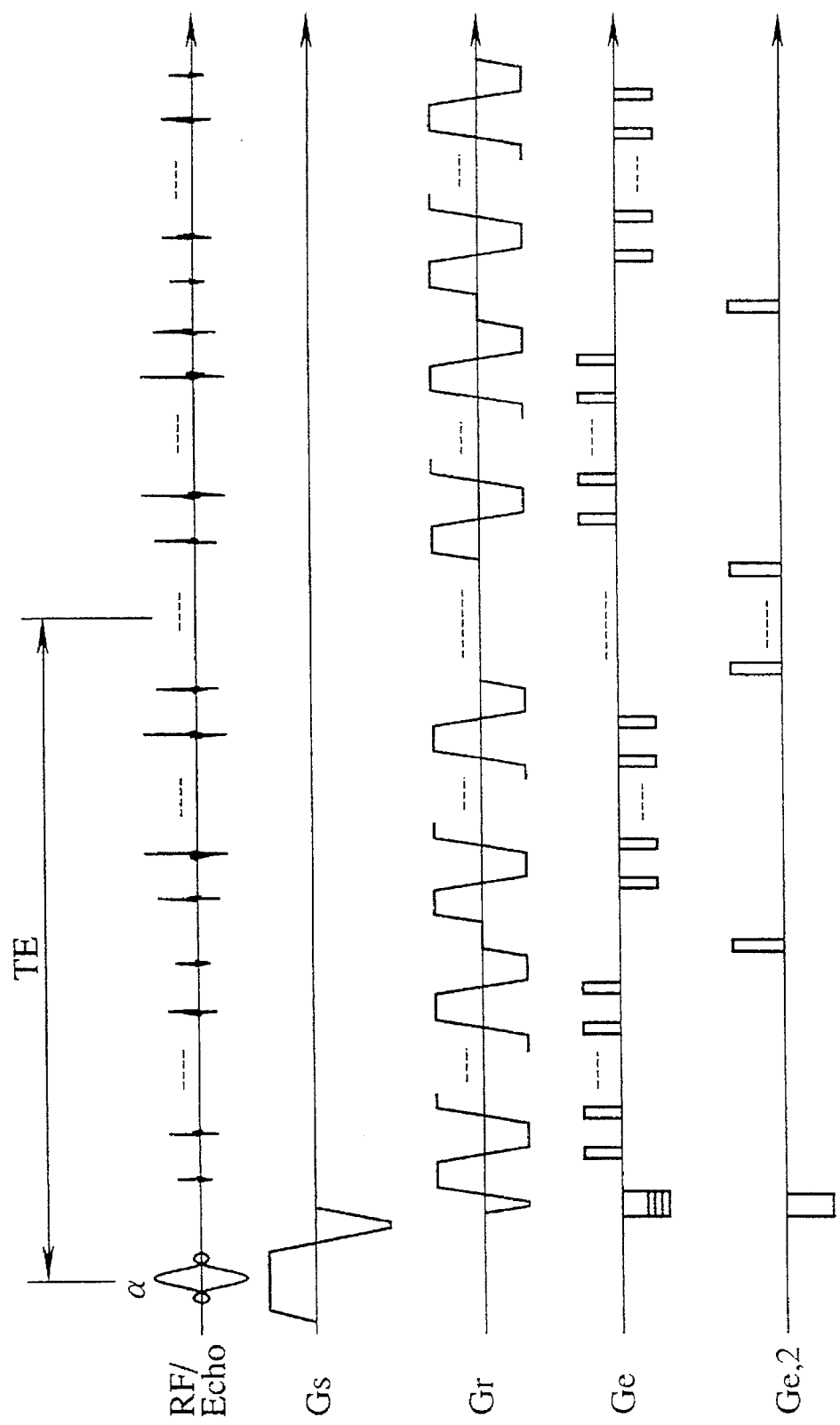

● ━▶ 1ST EXCITATION
○ ┈▶ 2ND EXCITATION

● ━▶ 1ST EXCITATION
○ ┈▶ 2ND EXCITATION

● ——▶ 1ST EXCITATION
○ ┅┅▶ 2ND EXCITATION

● ——▶ 1ST EXCITATION
○ ┅┅▶ 2ND EXCITATION

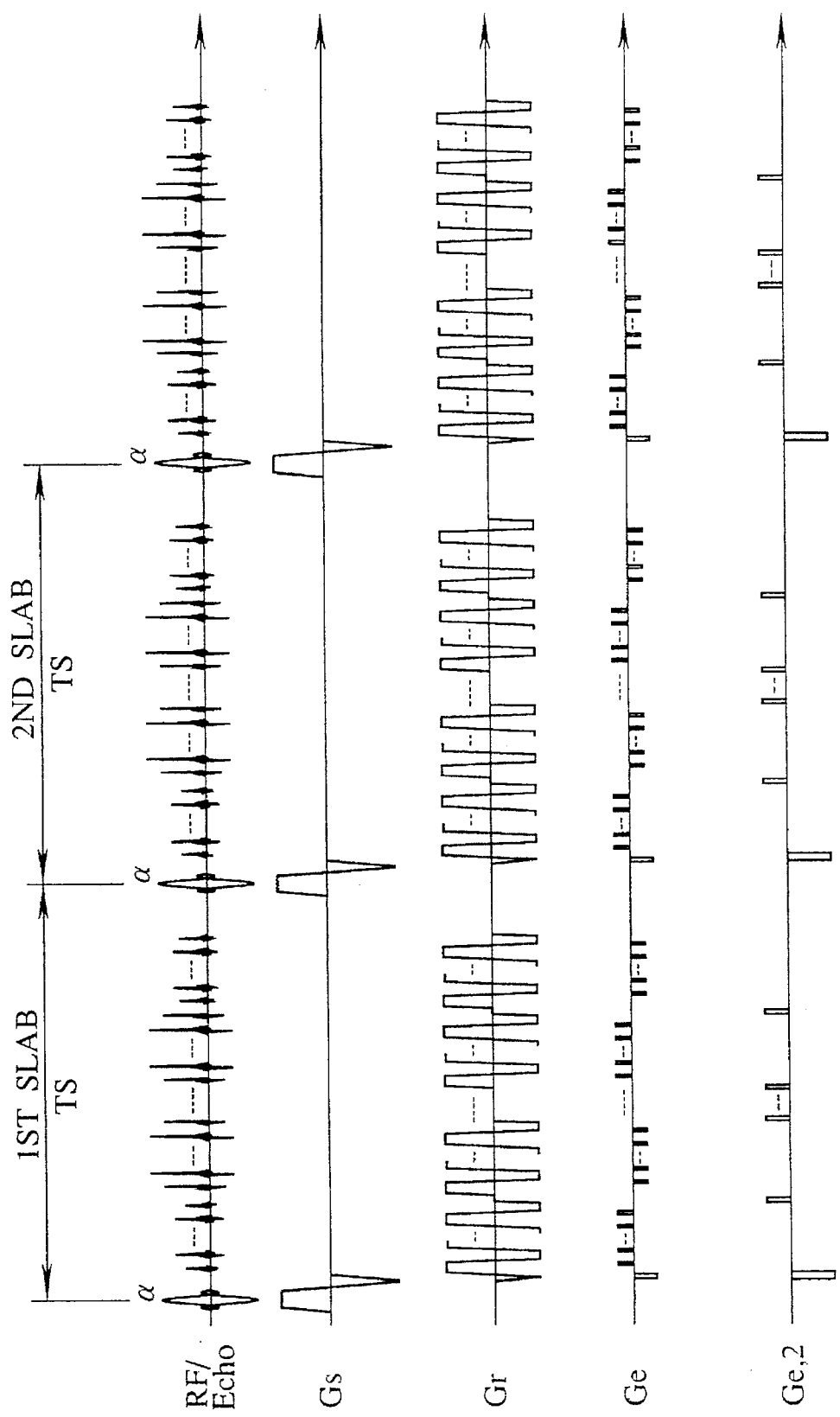

METHOD AND APPARATUS FOR HIGH SPEED THREE DIMENSIONAL NUCLEAR MAGNETIC RESONANCE IMAGING

BACKGROUND OF THE INVENTION

1. Field of the Invention

The present invention relates to a nuclear magnetic resonance imaging, and more particularly, to a nuclear magnetic resonance imaging suitable for imaging three dimensional physiological function information of an interior of a body to be examined at high speed.

2. Description of the Background Art

In recent years, among various types of medical diagnostic apparatuses developed, the nuclear magnetic resonance imaging (MRI) apparatus has been studied and developed very actively.

As well known, the nuclear magnetic resonance imaging is a method for imaging microscopic chemical and physical information of matters by utilizing the nuclear magnetic resonance phenomenon in which the energy of a radio frequency magnetic field rotating at a specific frequency can be resonantly absorbed by a group of nuclear spins having unique magnetic moments which are placed in a homogeneous static magnetic field.

This nuclear magnetic resonance imaging has attracted much attention because of its capability for imaging not just a physical shape information on a living body at high contrast, but also various other types of functional information such as a blood flow information, a microscopic magnetic field inhomogeneity information, a diffusion information, and a chemical shift information.

In particular, the study of the brain function imaging for imaging a change of the magnetic susceptibility of the hemoglobin in blood is very active recently.

Namely, as described in S. Ogawa et al.: "Oxygenation-Sensitive Contrast in Magnetic Resonance image of Rodent Brain at High Magnetic Fields", Magnetic Resonance in Medicine 14, pp. 68–78, 1990, it is known that, among the hemoglobin contained in blood of a living body, the oxyhemoglobin contained in abundance in the arterial blood is diamagnetic, while the deoxyhemoglobin mainly contained in the venous blood is paramagnetic.

Then, as described in R. M. Weisskoff et al.: "MRI Susceptometry: Image-Based Measurement of Absolute Susceptibility of MR contrast Agents and Human Blood", Magnetic Resonance in Medicine 24, pp. 375–383, 1992, it is also known that the diamagnetic oxyhemoglobin does not disturb a local magnetic field very much (magnetic susceptibility difference of 0.02 ppm with respect to living body tissues), but the paramagnetic deoxyhemoglobin has sufficiently large magnetic susceptibility difference with respect to surrounding tissues (magnetic susceptibility difference of 0.15 ppm with respect to living body tissues) to disturb the magnetic field so that the parameter $T_2$*. (which is a time constant parameter reflecting a lowering rate of the voxel signals based on an abrupt phase change of the nuclear spins caused by a microscopic magnetic field inhomogeneity change within a voxel) is going to be shortened.

Consequently, in peripheral veins within a region at which a brain function is activated where an amount of oxyhemoglobin is excessively increased, a local magnetic field inhomogeneity will be reduced compared with an inactive case and therefore voxel signals are going to be stronger. Hereafter, this effect will be referred as the BOLD (Blood Oxygen Level Dependent) effect.

Conventionally, an imaging scheme used for obtaining the brain function imaging has been the field echo imaging scheme, or the two dimensional echo planar imaging (2D-EPI) scheme illustrated in FIGS. 1 and 2. Here, FIG. 1 shows a typical pulse sequence in the 2D-EPI scheme, for a ease of acquiring the FID (Free Induction Decay) signals in which the BOLD effect is expected to be large. In the following, this case of acquiring the FID signals will be considered mostly. As can be seen from FIG. 1, this pulse sequence is characterized by a repeated inversion of the powerful reading gradient field pulse $G_r$ and a continuous application of the encoding gradient field short pulses $G_e$. On the other hand, FIG. 2 shows a manner of data sampling (referred hereafter as k-trajectory) in the spatial frequency region (referred hereafter as k-space) of this scheme, in which the desired k-space data (in reading and encoding directions) are entirely acquired by a single excitation. In FIG. 2, an arrow indicates a direction of data sampling. In this case, the echo time will be optimally set to maximize the BOLD effect.

Now, in a practical realization of the brain function imaging, what is considered as one of the essential conditions is that it is "capable of comprehending functions of the entire brain three dimensionally, within a time (less than or equal to 1 second for example) in which an influence of a time change of a size or a position of the brain itself (in synchronization with the heart beat or the pulsation of cerebrospinal fluid) can be considerably reduced". In the following, whether this condition has been satisfied by some schemes proposed up until now will be considered in concrete details. Here, the basic conditions to be used in estimating the effect of each scheme will be set as follows:

$X_r = X_e = 192\text{mm}, X_{e,2} = 96 \text{ mm},$ $\Delta X_r = \Delta X_{e,2} = 3\text{mm},$ $N_r = N_e = 64, N_{e,2} = 32,$ TE=50ms, $R_{DAT} = 1.0$, and T1=787ms, T2=92ms, where $X_r$, $X_e$, and $X_{e,2}$ are imaging region (FOV: field of view) in reading, encoding, and second encoding (=slicing) directions, respectively, $\Delta X_r$, $\Delta X_e$, and $\Delta X_{e,2}$ are spatial resolutions in reading, encoding, and second encoding (=slicing) directions, respectively, $N_r$, $N_e$, and $N_{e,2}$ are numbers of image matrices in reading, encoding, and second encoding (=slicing) directions, respectively, TE is an echo time (with the BOLD effect taken into account). $R_{DAT}$ is an encoding direction data acquisition rate (which is equal to 1.0 in a full encoding method and 0.5 in a half encoding method). T1 is a longitudinal relaxation time, and T2 is a transverse relaxation time.

As a first conventional scheme, the 2D-EPI multi-slice scheme using a pulse sequence shown in FIG. 3 will be considered first. In this scheme, for three different strengths (5.8 mT/m, 13.5 mT/m, and 40 mT/m) of the reading gradient field $G_r$ (cases 1A, 1B, and 1C), an imaging time $T_{scan}$, a relative image S/N, and levels of image degradation (image distortion, T2 image blurring and N/2 artifact) are as summarized in a table shown in FIG. 4. Here, the N/2 artifact is caused by the static magnetic field inhomogeneity, the system incompleteness, and the inversion of a sign of the reading magnetic field. Also, in FIG. 4, $\Delta T_{sw,r}$ is a read switching time (0→ peak), $M_s$ is a number of multi-slices, DAT is a data acquisition time per one excitation, TR is an identical region excitation interval (repetition time), $\alpha$ is a flip angle, and TS is a sequence length per one slice.

As can be understood from FIG. 4, from case 1A to case 1C, the relative image S/N is lowered, while the various image degradation levels are improved and the imaging time is shortened, but the minimum value for the total imaging time to cover the entire FOV is limited by 2 sec., so that the above noted influence of motion cannot be ignored. Here, however, the imaging time per one slice TS is 62.5 ms to 100 ms. In order to achieve the total imaging time of less than or equal to 1 sec. for which the influence of motion can be reduced considerably, it is necessary to reduce a number of slices (i.e., the FOV) considerably. Moreover, the slice thickness of 3 mm raises a problem of a slice characteristic, and it becomes difficult to realize the isotropic resolution. Also, in case 1A, the relative image S/N is more than twice as much as that in case 1C, but the imaging time is even longer and the image degradation such as the N/2 artifact is even worse, so that this case 1A is practically intolerable.

Next, as a second conventional scheme, the 3D-EPI scheme with a pulse sequence shown in FIG. 5 will be considered. In this scheme, the the second encoding step is varied from one spin excitation to another by a constant value, and only two dimensional data in the reading and encoding directions are acquired by each excitation. This is a scheme which is equally popular as the first conventional scheme described above. In this scheme, for three different strengths (5.8 mT/m, 13.5 mT/m, and 40 mT/m) of the reading gradient field $G_r$ (cases 2A, 2B, and 2C), the imaging time $T_{scan}$, the relative image S/N, and the levels of image degradation (image distortion, T2 image blurring, and N/2 artifact) are as summarized in a table shown in FIG. 6. Here, $N_{e,2}$ indicates a number of sampling in the second encoding (3D) direction, and the flip angle $\alpha$ is approximated by the Ernst angle $\alpha_e$ in the FLASH scheme. Also, a reference value for the relative image S/N is set to be the value in case 1C of the first conventional scheme described above.

As can be understood from FIG. 6, from case 2A to case 2C, the relative image S/N is lowered, while the various image degradation levels are improved and the imaging time is shortened, but the minimum value for the total imaging time to cover the entire FOV is limited by 2 sec., so that the above noted influence of motion cannot be ignored. In order to achieve the total imaging time of less than or equal to 1 sec. for which the influence of motion can be reduced considerably, it is necessary to reduce the imaging region (FOV) considerably. These features are the same as in the first conventional scheme described above. What is different from the first conventional scheme is that it is impossible to obtain a partial image data unless the imaging is completed for the entire FOV, so that the influence of motion is more significant in this second conventional scheme. Here, however, the fact that the three dimensionally isotropic resolution can be obtained and the fact that the relative image S/N can be improved by the integrate effect are the merits over the first conventional scheme. Also, in case 2A, the relative image S/N is more than three times as much as that in case 2C due to the integrated effect in third dimensional direction, which is a further improvement over the first conventional scheme, but the imaging time is even longer and the image degradation such as the N/2 artifact is even worse, so that this case 2A is also practically intolerable just, like case 1A of the first conventional scheme.

Next, as a third conventional scheme, the scheme proposed by Mansfield, et al. (Japanese Patent Application Laid Open No. 2-131746 (1990)) with a pulse sequence shown in FIG. 7 and a k-trajectory shown in FIG. 8 will be considered. This scheme is basically a one shot 3D (volume) imaging= EVI, which is characterized by the fact that the second encoding gradient field pulse $G_{e,2}$ is changed similarly as the first encoding gradient field $G_e$ during one excitation. Here, however, a number of echoes that can be acquired per one excitation is limited by the gradient field performance and the echo time, so that this scheme has an essential problem that if the same spatial resolution as in the other schemes is to be achieved, the FOV in the second encoding direction would be reduced considerably, whereas if the same FOV in the second encoding direction as in the other schemes is to be achieved, the spatial resolution would be degraded considerably.

In this scheme, for case 3C with 40 mT/m of the reading gradient field $G_r$ which is the only case having a sufficiently high gradient field performance for enabling the EVI, the imaging time $T_{scan}$, the relative image S/N, and the levels of image degradation (image distortion, T2 image blurring, and N/2 artifact) are as summarized in a table shown in FIG. 9. Here, $N_{echo}$ is a total number of echoes acquired per one excitation. Also, the artifact due to T2 data discontinuity is an artifact caused by the step-wise change of the signal strength due to the T2 dissipation that occurs in each sampling in the second encoding direction, and this artifact becomes prominent when a number of encoding samplings is small compared with the data acquisition time per one excitation. Also, a reference value for the relative image S/N is set to be the value in case 1C of the first conventional scheme described above.

As can be understood from FIG. 9, the relative image S/X is twice as much as that in the first conventional scheme, and this is the integrated effect caused by the fact that the number of samplings in the second encoding direction is four times as much. The imaging time is as fast as 0.1 sec. because of the one shot imaging, but there is a fatal problem in that the FOV in the second encoding direction is considerably reduced to only 12 mm. In addition, there are also problems in that the artifact due to T2 data discontinuity becomes large, and that when the slice thickness is thin, it cannot take an advantage of the isotropy of the spatial resolution in the volume imaging because of the slice characteristic.

As discussed in concrete details above, it is shown that the first conventional scheme (2D-EPI multi-slice scheme) and the second conventional scheme (3D-EPI scheme) have an absolute limit in the shortening of the imaging time with respect to the desired resolution and the imaging region. Also, as for the third conventional scheme (EVI scheme), it is shown that the imaging time is sufficiently fast, but the imaging region size is considerably limited.

Consequently, up until now, there has been no proposition for a practical 3D brain function imaging scheme which satisfies the condition of being "capable of comprehending functions of the entire brain three dimensionally, within a time (less than or equal to 1 second for example) in which an influence of a time change of a size or a position of the brain itself can be considerably reduced". More generally, there has been no proposition for an ultra high speed 3D imaging scheme with sufficiently high image quality.

SUMMARY OF THE INVENTION

It is therefore an object of the present invention to provide a method and an apparatus for nuclear magnetic resonance imaging which realize a practical 3D brain function imaging scheme satisfying the condition of being "capable of comprehending functions of the entire brain three dimensionally, within a time (less than or equal to 1 second for example) in which an influence of a time change of a size or a position of the brain itself can be considerably reduced".

More generally, it is an object of the present invention provide a method and an apparatus for nuclear magnetic resonance imaging which realize a high speed 3D imaging scheme with sufficiently high image quality.

According to one aspect of the present invention there is provided an apparatus for nuclear magnetic resonance imaging, comprising: imaging means for imaging a body to be examined placed in a homogeneous static magnetic field by applying radio frequency magnetic field and gradient magnetic fields according to a pulse sequence, detecting nuclear magnetic resonance signal emitted from the body to be examined in response to the radio frequency magnetic field and the gradient magnetic fields, and processing the nuclear magnetic resonance signals to construct nuclear magnetic resonance images; and control means for controlling the pulse sequence to realize a three dimensional imaging sequence with a division scan in at least one of a first encoding direction and a second encoding direction.

According to another aspect of the present invention there is provided an apparatus for nuclear magnetic resonance imagine, comprising: imaging means for imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and control means for controlling the pulse sequence to realize a three dimensional imaging sequence with first encoding gradient field pulses and second encoding gradient field pulses for defining regular sampling pitches in first and second encoding directions, where at least one of the first encoding gradient field pulses and the second encoding gradient field pulses has a lead-in pulse in regularly changing magnitude for each spin excitation.

According to another aspect of the present invention there is provided a method of nuclear magnetic resonance imaging, comprising the steps of: imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and controlling the pulse sequence to realize a three dimensional imaging sequence with a division scan in at least one of a first encoding direction and a second encoding direction.

According to another aspect of the present invention there is provided a method of nuclear magnetic resonance imaging, comprising the steps of: imaging a body to be examined placed in a homogeneous static magnetic field by applying radio frequency magnetic field and gradient magnetic fields according to a pulse sequence detecting nuclear magnetic resonance signals emitted from the body to be examined in response to the radio frequency magnetic field and the gradient magnetic fields, and processing the nuclear magnetic resonance signals to construct nuclear magnetic resonance images; and controlling the pulse sequence to realize a three dimensional imaging sequence with first encoding gradient field pulses and second encoding gradient field pulses for defining regular sampling pitches in first and second encoding directions, where at least one of the first encoding gradient field pulses and the second encoding gradient field pulses has a lead-in pulse in regularly changing magnitude for each spin excitation.

Other features and advantages of the present invention will become apparent from the following description taken in conjunction with the accompanying drawings.

BRIEF DESCRIPTION OF THE DRAWINGS

FIG. 4 is a table summarizing various imaging parameters, an imaging time, a relative image S/N, and image degradation levels for three settings of a reading gradient field strength in the first conventional scheme of FIG. 3.

FIG. 6 is a table summarizing various imaging parameters, an imagine time, a relative image S/N, and image degradation levels for three settings of a reading gradient field strength in the second conventional scheme of FIG. 5.

FIG. 9 is a table summarizing various imaging parameters, an imaging time, a relative image S/N, and image degradation levels for one setting of a reading gradient field strength in the third conventional scheme of FIG. 7.

FIG. 13 is n table summarizing various imaging parameters, an imaging time, and a relative image S/N for two settings of a reading gradient field strength in the first embodiment of FIG. 11.

FIG. 20 is a sequence chart for a pulse sequence in a fifth embodiment of a nuclear magnetic resonance imaging scheme according to the present invention.

FIG. 24 is a sequence chart for a pulse sequence in a seventh embodiment of a nuclear magnetic resonance imaging scheme according to the present invention.

DETAILED DESCRIPTION OF THE PREFERRED EMBODIMENTS

Now, with references to the drawings, various embodiment of a method and an apparatus for nuclear magnetic resonance imaging according to the present invention will be described in detail.

Figure 10:
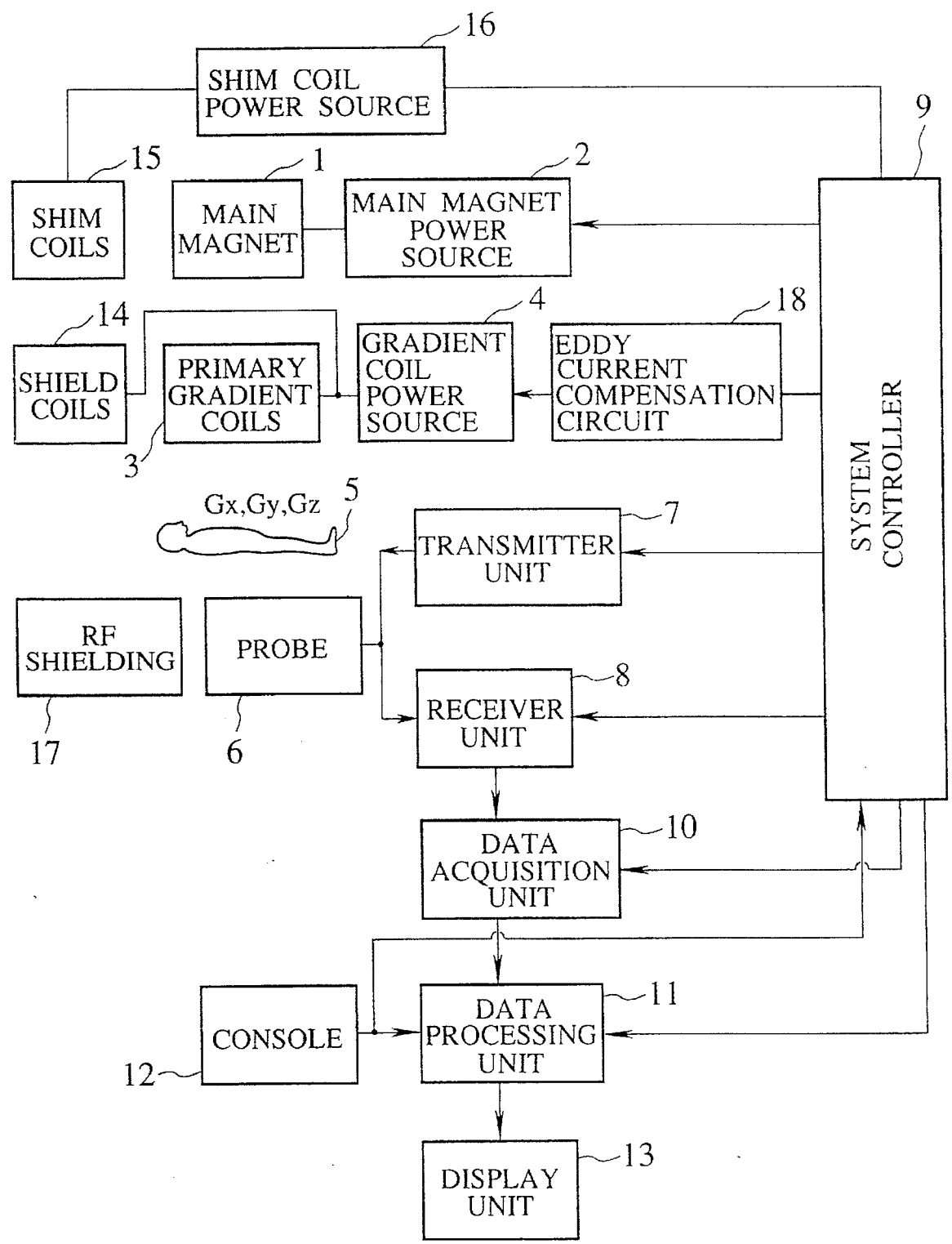
FIG. 10 is a block diagram of an embodiment of a nuclear magnetic resonance imaging apparatus according to the present invention.

In all the embodiments to be described in detail below, the apparatus for nuclear magnetic resonance imaging according to the present invention has a configuration as shown in FIG. 10, which comprises: a main magnet 1 for generating a static magnetic field: a main magnet power source 2 for driving the main magnet 1; primary gradient coils 3 for generating gradient magnetic fields; shield coils 14 provided around the primary gradient coils 3; a gradient coil power source 4 for driving the primary gradient coils 3 and the shield coils 14; an eddy current compensation circuit 18 for adjusting inputs to the gradient coil power source 4 so as to compensate the effect due to the eddy current; shim coils 15 for adjusting the homogeneity of the static magnetic field; shim coil power source 16 for driving the shim coils 15; a probe 6 for applying radio frequency (RF) pulses to a body to be examined 5 and receiving nuclear magnetic resonance (NMR) signals from the body to be examined 5; an RF shielding 17 provided between the primary gradient coils 3 and the probe 6; a transmitter unit 7 for driving the probe 6 to transmit the desired RF pulses; and a receiver unit 8 for detecting the NMR signals received by the probe 6.

In addition, this apparatus of FIG. 10 further comprises: a data acquisition unit 10 for acquiring and A/D converting the NMR signals detected by the receiver unit 8; a data processing unit 11 for data processing the A/D converted NMR signals to reconstruct the desired NMR image; a display unit 13 for displaying the NMR image reconstructed by the data processing unit 11; a system controller 9 for controlling the operations of the main magnet power source 2, the gradient coil power source 4, the eddy current compensation circuit 38, the transmitter unit 7, the receiver unit 8, the data acquisition unit 10, and the data processing unit 11, so as to realize the desired imaging pulse sequence; and a console 12 from which an operator enters various control commands to the system controller 9 and the data processing unit 11.

Here, the main magnet 1 is driven by the main magnet power source 2 while the primary gradient coils 3 and the shield coils 14 are driven by the gradient coil power source 4 such that a uniform static magnetic field and the gradient magnetic fields having linear gradients in three mutually orthogonal directions are applied onto the body to be examined 5. The primary gradient coils 3 and the shield coils 14 may be connected in series and driven by the common gradient coil power source 4, or upper, lower, right, and left coil elements may be separately connected with a plurality of gradient coil power sources 4 and separately driven by the respective gradient coil power sources 4. The input signals to be given to the gradient coil power source 4 for compensating eddy current magnetic field time response are generated at the eddy current compensation circuit 18.

In this apparatus of FIG. 10, the body to be examined 5 is placed inside the static magnetic field generated by the main magnet 1, and three orthogonal gradient magnetic fields generated by the primary gradient coils 3 are superposed onto the static magnetic field while the RF pulses are applied by the probe 6, according to the desired imaging pulse sequence. Then, the NMR signals emitted from the patient 5 in response to the application of the RF pulses are received by the probe 6. Here, the common probe 6 may be used for the transmission of the RF pulses and the reception of the NMR signals, or separate probes 6 may be provided for the transmission of the RF pulses and the reception of the NMR signals.

The NMR signals received by the probe 6 is detected at the receiver unit 8, A/D converted at the data acquisition unit 19, and sent to the data processing unit 11 which reconstructs the desired NMR images by using appropriate data processing operations such as the Fourier transformation. The reconstructed NMR images are then displayed at the display unit 13.

Now, the details of the pulse sequence and the k-trajectory to be realized by various embodiments of the method according to the present invention which define the operations of the apparatus of FIG. 10 will be described one by one.

Figure 1:
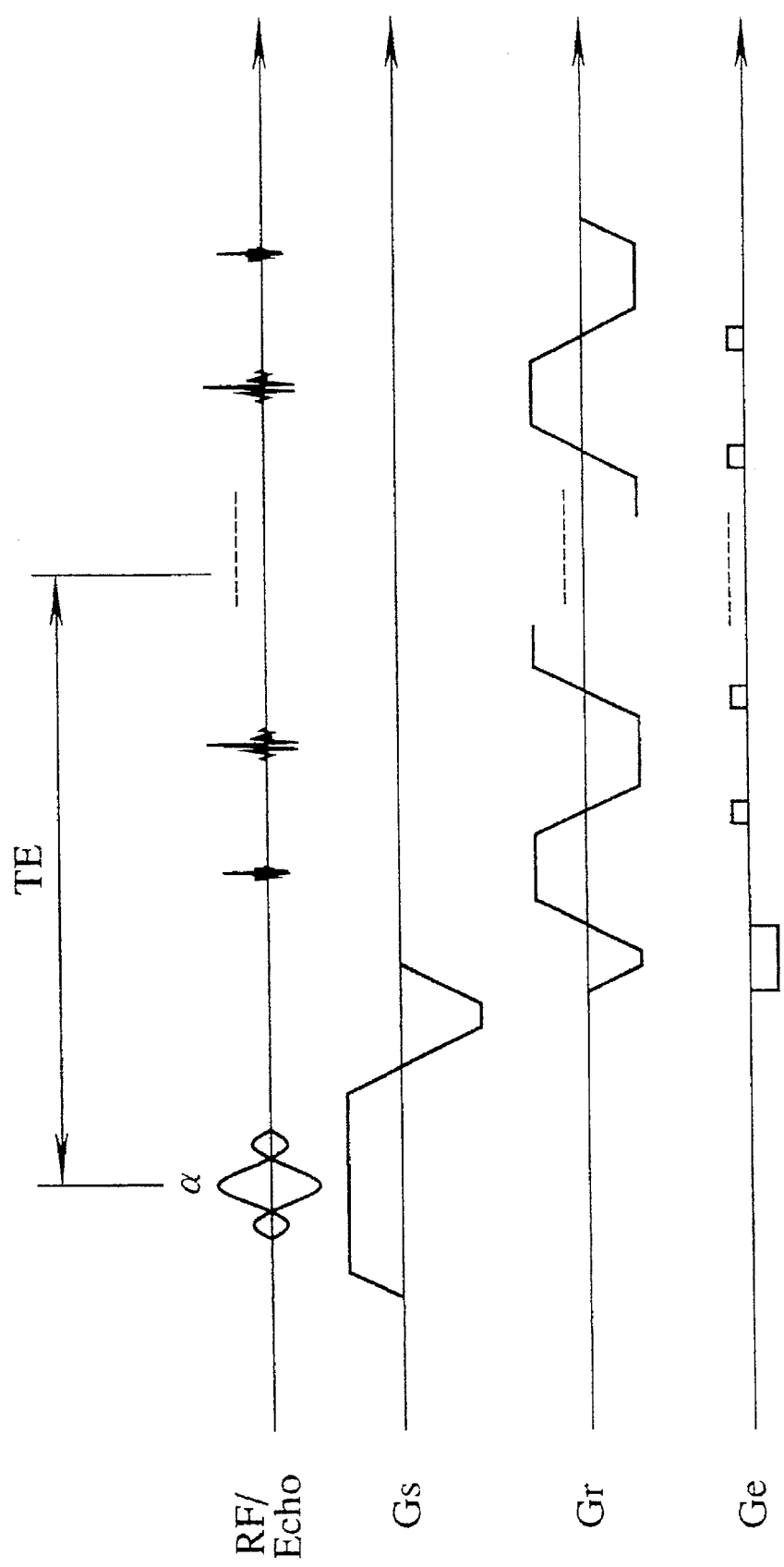
FIG. 1 is a sequence chart for a pulse sequence in a conventional 2D echo planar imaging scheme.
Figure 2:
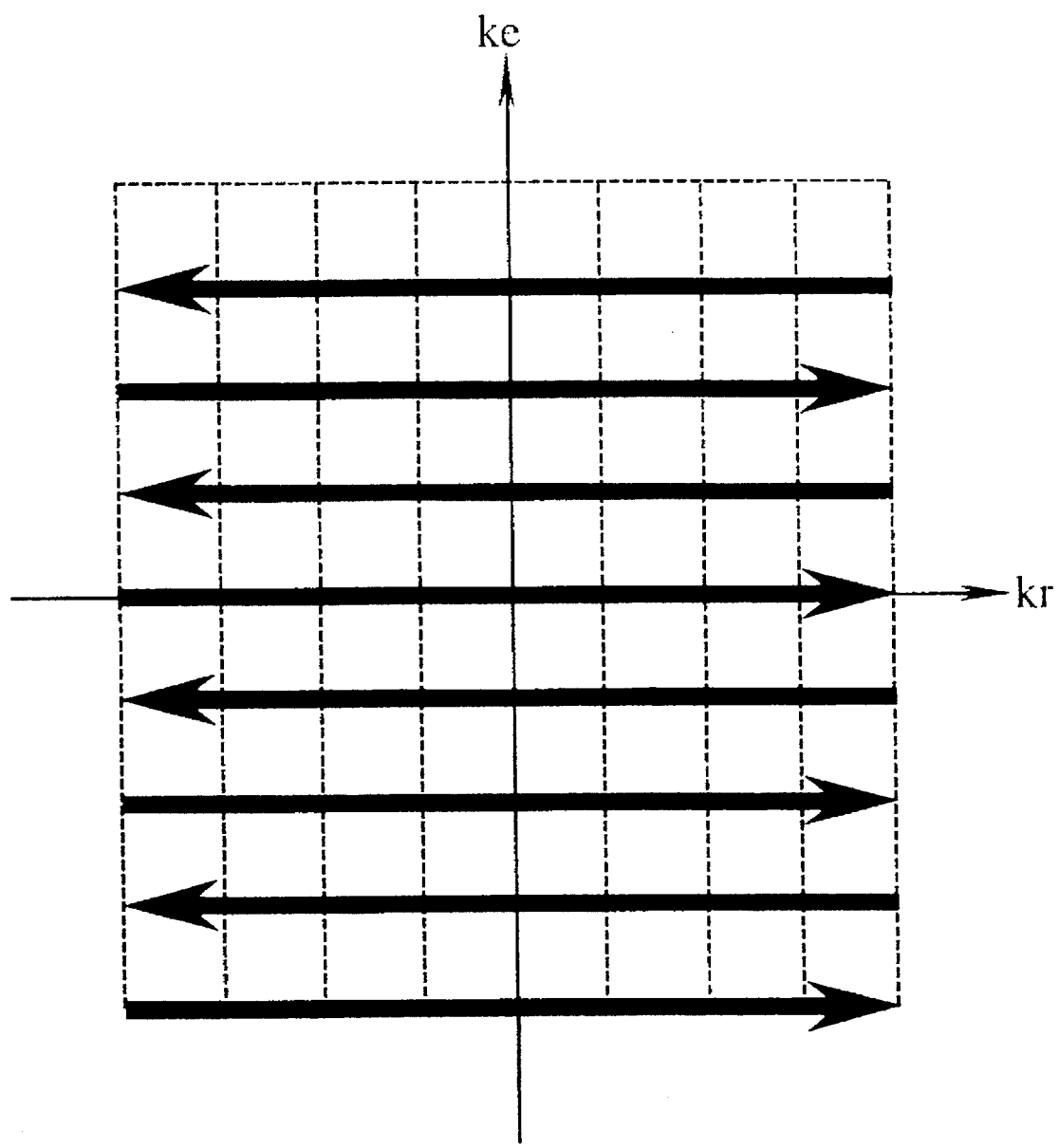
FIG. 2 is a k-space diagram for the conventional 2D echo planar imaging scheme of FIG. 1.
Figure 3:
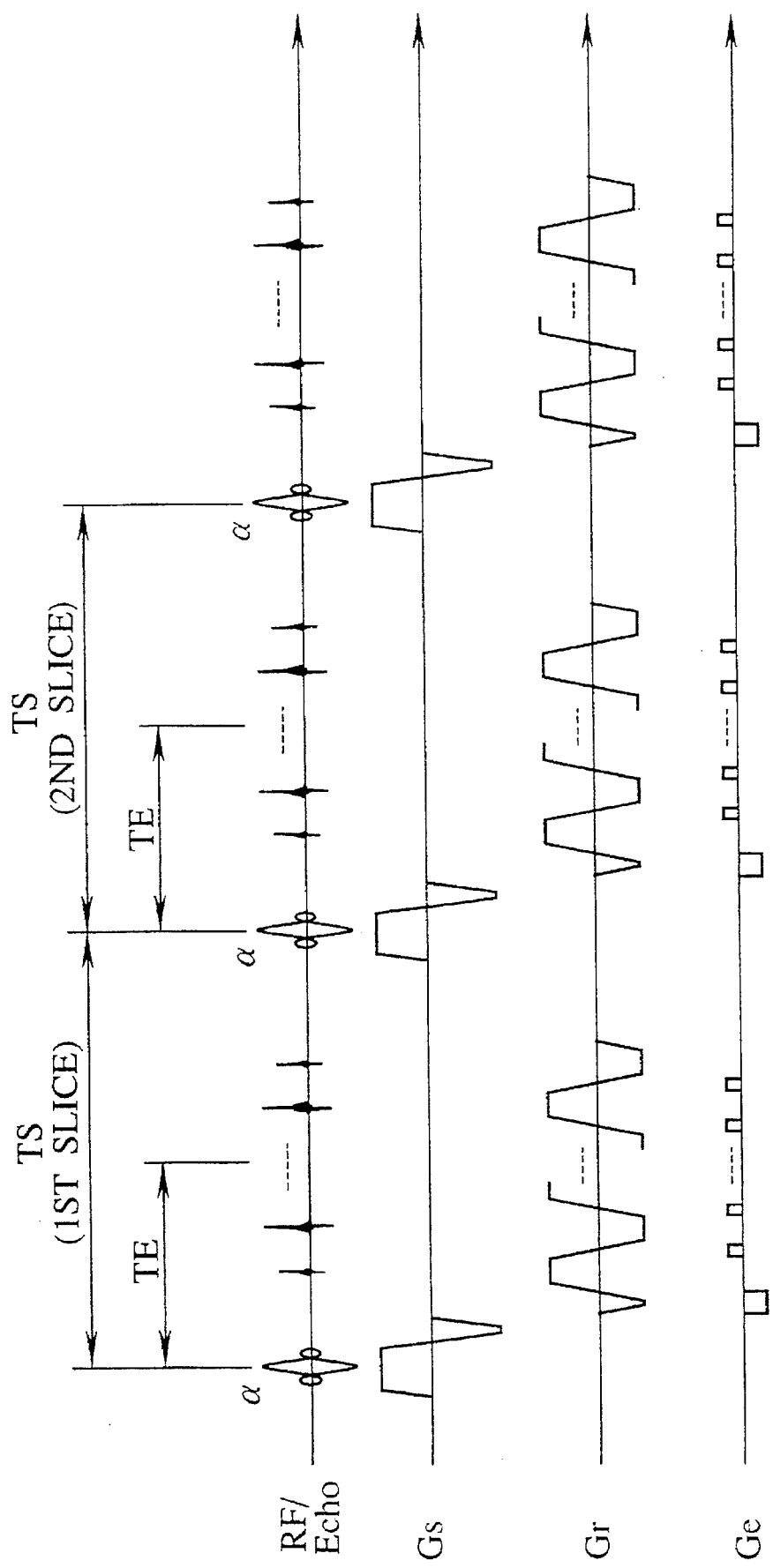
FIG. 3 is a sequence chart for a pulse sequence in a first conventional scheme (2D-EPI multi-slice scheme) for nuclear magnetic resonance imaging.
Figure 5:
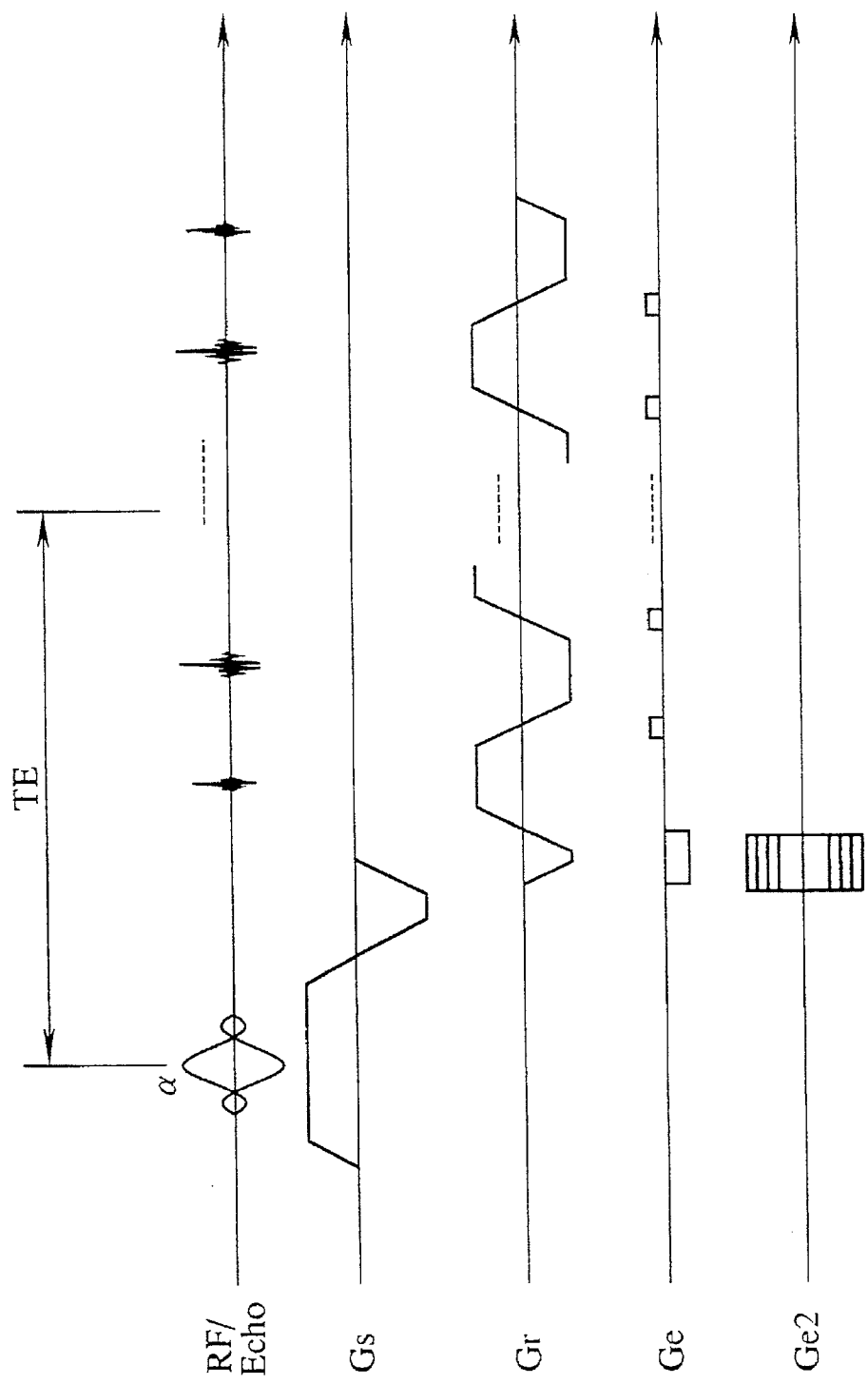
FIG. 5 is a sequence chart for a pulse sequence in a second conventional scheme (3D-EPI scheme) for nuclear magnetic resonance imaging.
Figure 7:
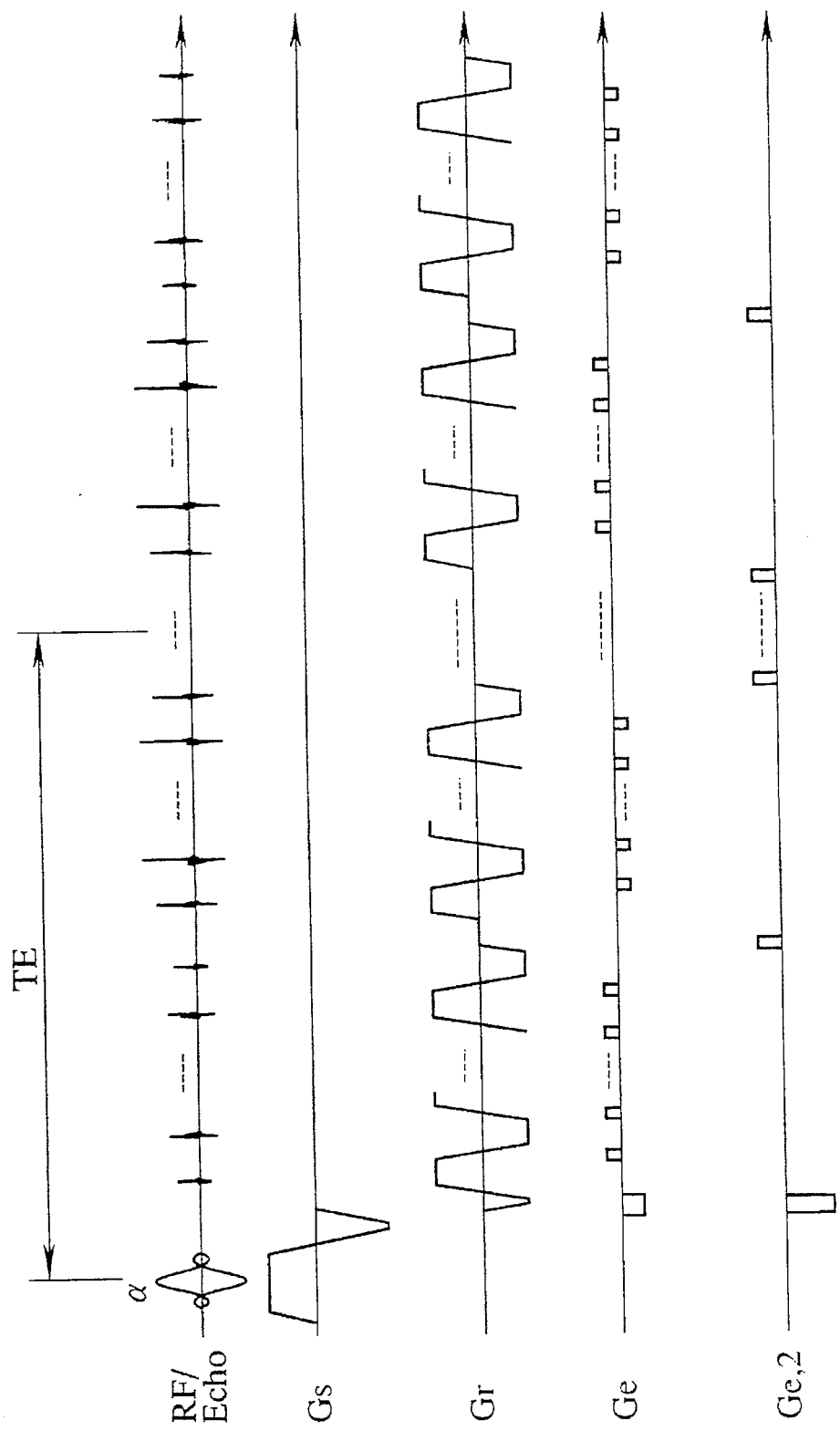
FIG. 7 is a sequence chart for a pulse sequence in a third conventional scheme (EVI scheme) for nuclear magnetic resonance imaging.
Figure 11:
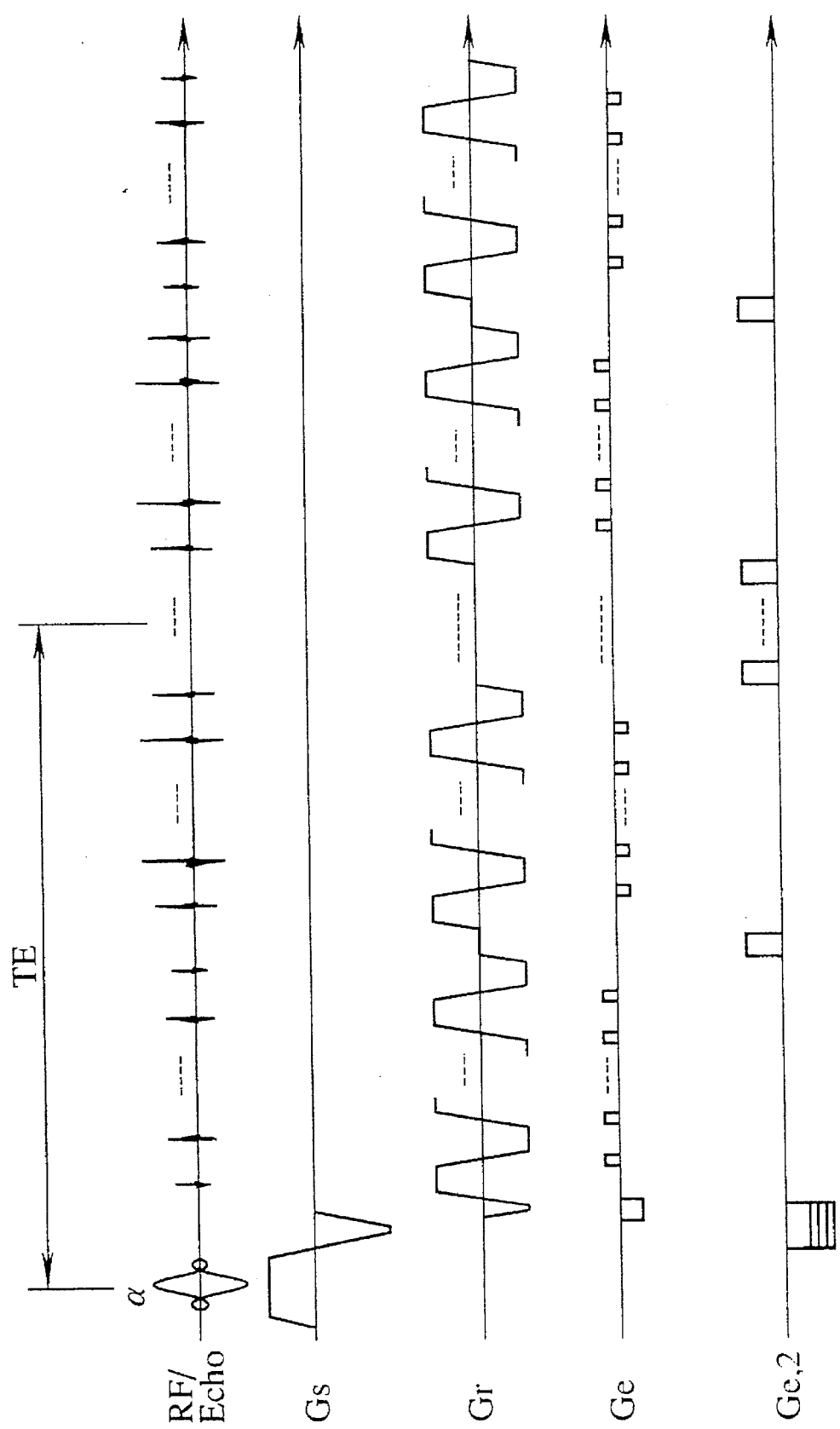
FIG. 11 is a sequence chart for a pulse sequence in a first embodiment of a nuclear magnetic resonance imaging scheme according to the present invention.
Figure 12:
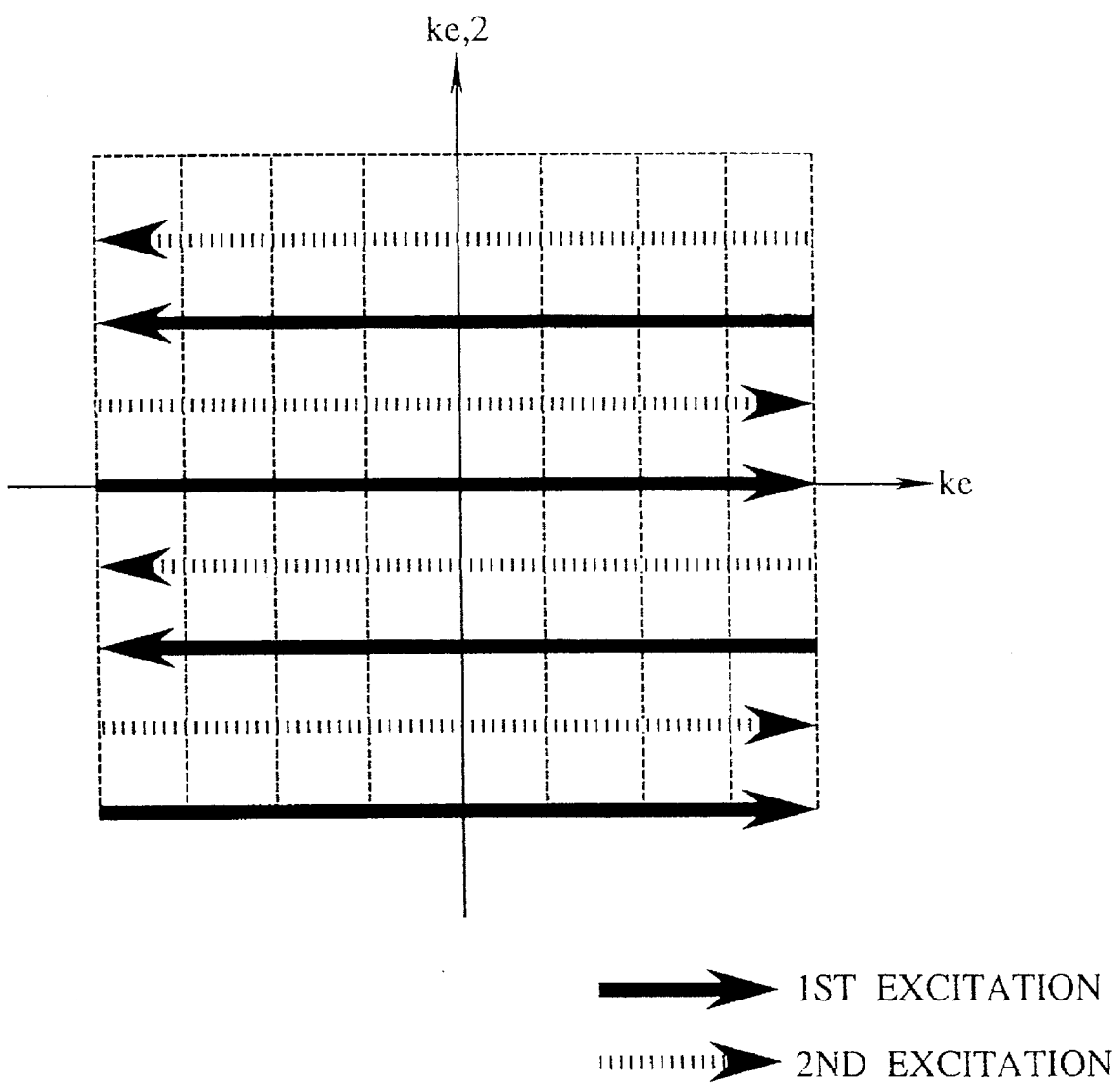
FIG. 12 is a k-space diagram for the first embodiment of FIG. 11.

The first embodiment of the method according to the present invention realizes the pulse sequence as shown in FIG. 11 and the k-trajectory as shown in FIG. 12. Here, the pulse sequence of FIG. 11 seemingly resembles that of the EVI scheme shown in FIG. 7 described above, but differs in that an amplitude of the lead-in pulse used at the beginning of the EPI type encoding step in the third dimension (the second encoding gradient field pulse $G_{e,2}$) is regularly changed in each of a plurality of spin excitations, such that all the necessary k-space data are acquired over all of these spin excitations. i.e., in a manner of division scan. Namely, in this first embodiment, all the points on the k-space for the reading direction (first dimension) and the first encoding direction (second dimension) are sampled in each excitation (i.e., a number of divided scans is one), but in the second encoding direction (third dimension), the data are acquired by the division scans (i.e., a number of divided scans is more than one). Also, in this pulse sequence of FIG. 11, the sign of the first encoding gradient field pulses $G_e$ is inverted every time the second encoding gradient field pulse $G_{e,2}$ is applied.

FIG. 12 shows the k-trajectory in the first and second encoding directions for an exemplary case of using two spin excitations, where solid lines indicate the k-trajectory for the first spin excitation and dashed lines indicate the k-trajectory for the second spin excitation. Here, by denoting a number of divided scans in the second encoding direction as $N_{D,e,2}$, and a k-space size in the second encoding direction as $K_{e,2}$, the sampling pitch in the second encoding direction for each excitation can be expressed as $K_{e,2}/N_{D,e,2}$, and the initial position $k_{e,2}$ in the second encoding direction for the $n_{D,e,2}$-th excitation can be set by the following expression (1).

$$k_{e,2} = -K_{e,2}/2 + (n_{D,e,2} - 1) \tag{1}$$

Figure 19:
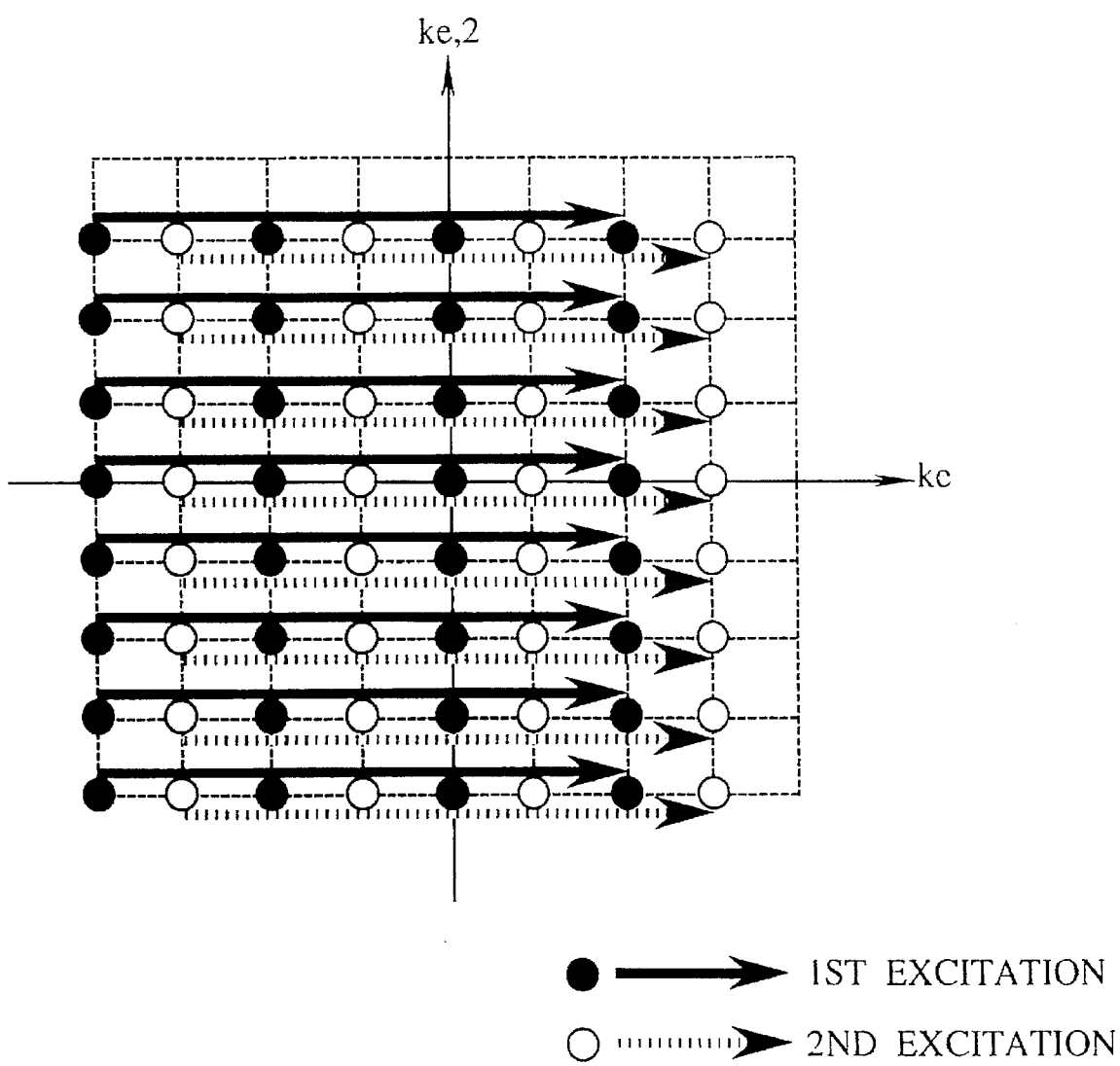
FIG. 19 is a k-space diagram for the fourth embodiment of FIG. 18.

It is to be noted that, in FIG. 12, the coordinate in the reading direction ($K_r$) is not depicted as it extends in a direction perpendicular to the plane of this FIG. 12, but the k-trajectory for $K_r$ and $K_{e,2}$ would appear substantially similar to that for $K_e$ and $K_{e,2}$ shown in FIG. 19. The same will also apply to all the following embodiments.

Here, the imaging performance in the present invention scheme which is common to all the embodiments of the method according to the present invention will be described in comparison with the conventional schemes. In the present invention scheme, for two different strengths (13.5 mT/m and 40 mT/m) of the reading gradient field $G_r$ (cases 4B and 4C), the imaging time $T_{scan}$ and the relative image S/N are as summarized in a table shown in FIG. 13. In FIG. 13, $N_{echo}$ is a total number of echoes acquired per one excitation, $N_{D,e}$ is a number of divided scans in the first encoding direction, $N_{D,e,2}$ is a number of divided scans in the second encoding direction, $N_{D,e,2/ex}$ is a number of samplings in the second encoding direction per one excitation, $N_{e,2}$ is a total number of samplings in the second encoding direction, and DAT (2D) is a data acquisition time required for all the samplings in the reading and first encoding directions. The other conditions and parameters are the same as in cases of the conventional schemes described above. Also, a reference value for the relative image S/N is set to be the value in case 1C ($G_r$=40 mT/m, $\Delta T_{sw,r}$=0.1 ms) of the first conventional scheme (2D-EPY multi-slice scheme) described above. As for the image degradation such as the image distortion (field inhomogeneity), the T2 image blurring, the artifact due to T2 data discontinuity, and the N/2 artifact, the levels of the image degradation will be described separately for each embodiment of the method according to the present invention.

As can be understood from FIG. 13, in case 4C, the imaging time is 0.8 sec. with respect to the desired resolution and the imaging region, which is less than 1 sec., in contrast to cases 1C and 2C in which the imaging time has been limited only up to 2 sec. In addition, this case 4C realizes the relative image S/N which is 1.44 times greater compared with a ease 1C, and 1.27 times greater compared with a case 2C. The reason for this improvement of the relative image S/N is that, in comparison with a case 1C, a contribution from the integrated effect (32 times) in the second encoding direction is greater than the lowering of the signal strength due to the reduced flip angle in this case 4C, and in comparison with a case 2C, a number of acquired echoes per one excitation is increased from 64 to 256 while the flip angle is also increased from 20.5° to 25.7° in this case 4C. It can also be seen that, even in a case 4B, a significant improvement of the imaging performance is achieved in comparison with cases 1B and 1C.

Thus, according to the present invention scheme, it becomes possible to realize the 3D brain function imaging having a truly isotropic spatial resolution with respect to a desired imaging region size (such as 192 mm×192 mm×92 mm in the above described example), within a time less than 1 sec. in which an influence of motion (a time change of a size or a position) of the brain itself can be considerably reduced, which could not have been realized by any conventional scheme.

Figure 8:
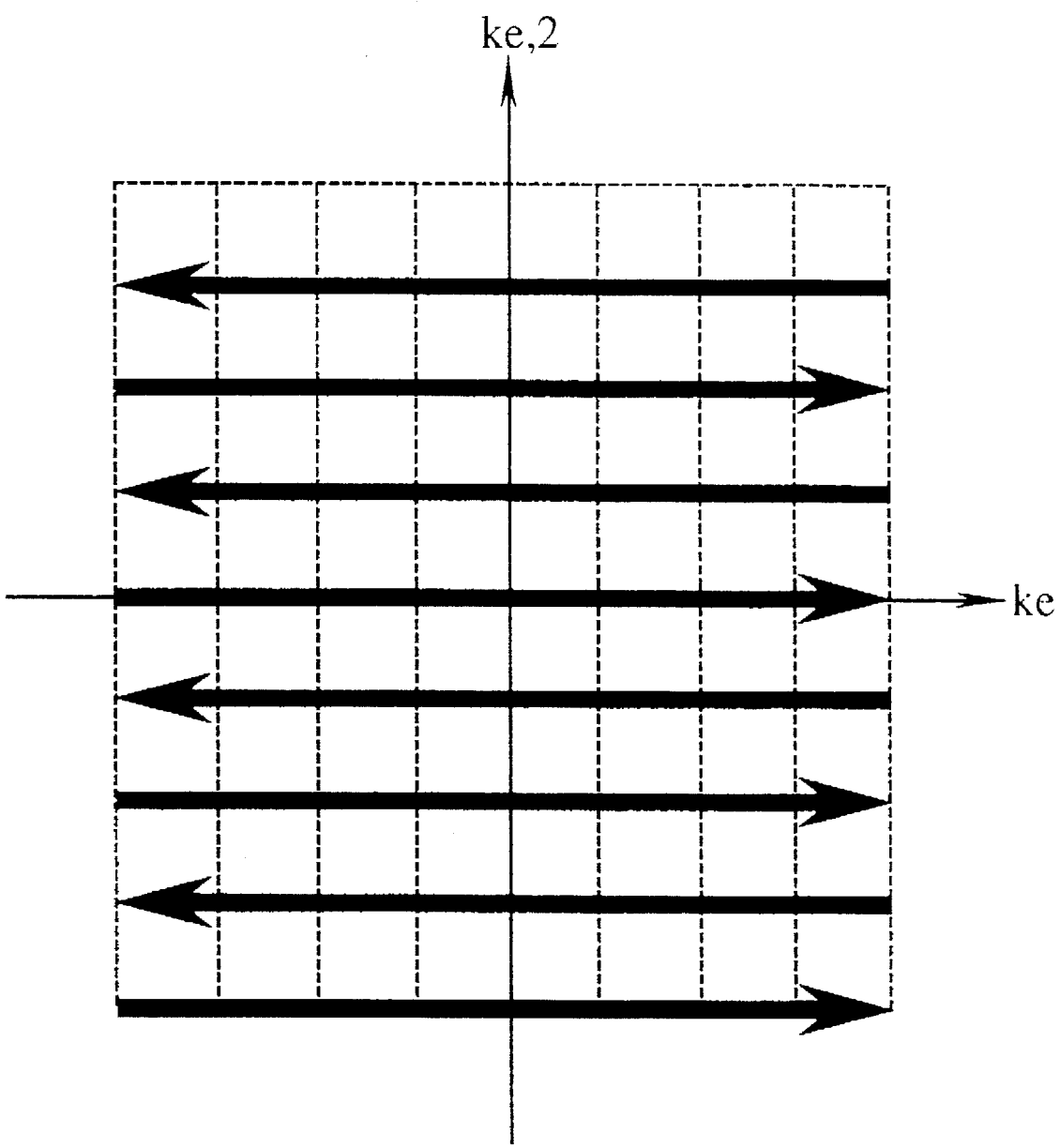
FIG. 8 is a k-space diagram for the third conventional scheme of FIG. 7.

As for the image degradation in the first embodiment of FIG. 11 and FIG. 12, the N/2 artifact in a plane of the first and second encoding directions, which is totally absent in the conventional EPI scheme, will be caused in this first embodiment, but it is considered that this N/2 artifact is not much of a problem in view of the considerably large reading gradient field strength used in this embodiment. There is also a possibility for the artifact to occur when a number of samplings in the second encoding direction per one excitation becomes small (or when a number of samplings in the first encoding direction increases), as the change in the signal strength due to the T2 dissipation between the second encoding direction sampling data becomes step-wise. As for the image distortion (field inhomogeneity) and the T2 image blurring, it is considered that the image degradation is at the same levels as in the conventional EVI scheme of FIG. 7 and FIG. 8 described above.

Figure 14:
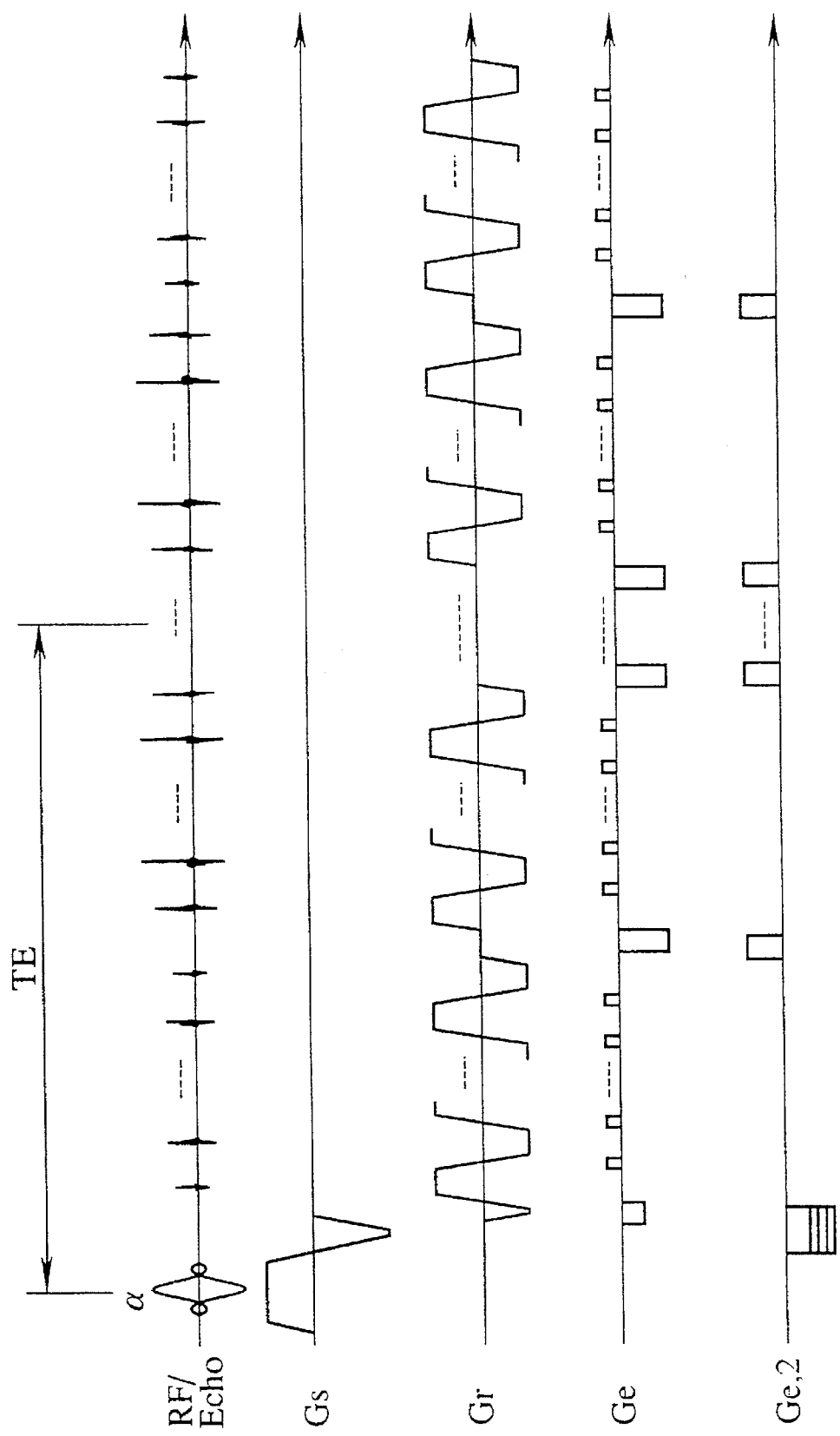
FIG. 14 is a sequence chart for a pulse sequence in a second embodiment of a nuclear magnetic resonance imaging scheme according to the present invention.
Figure 15:
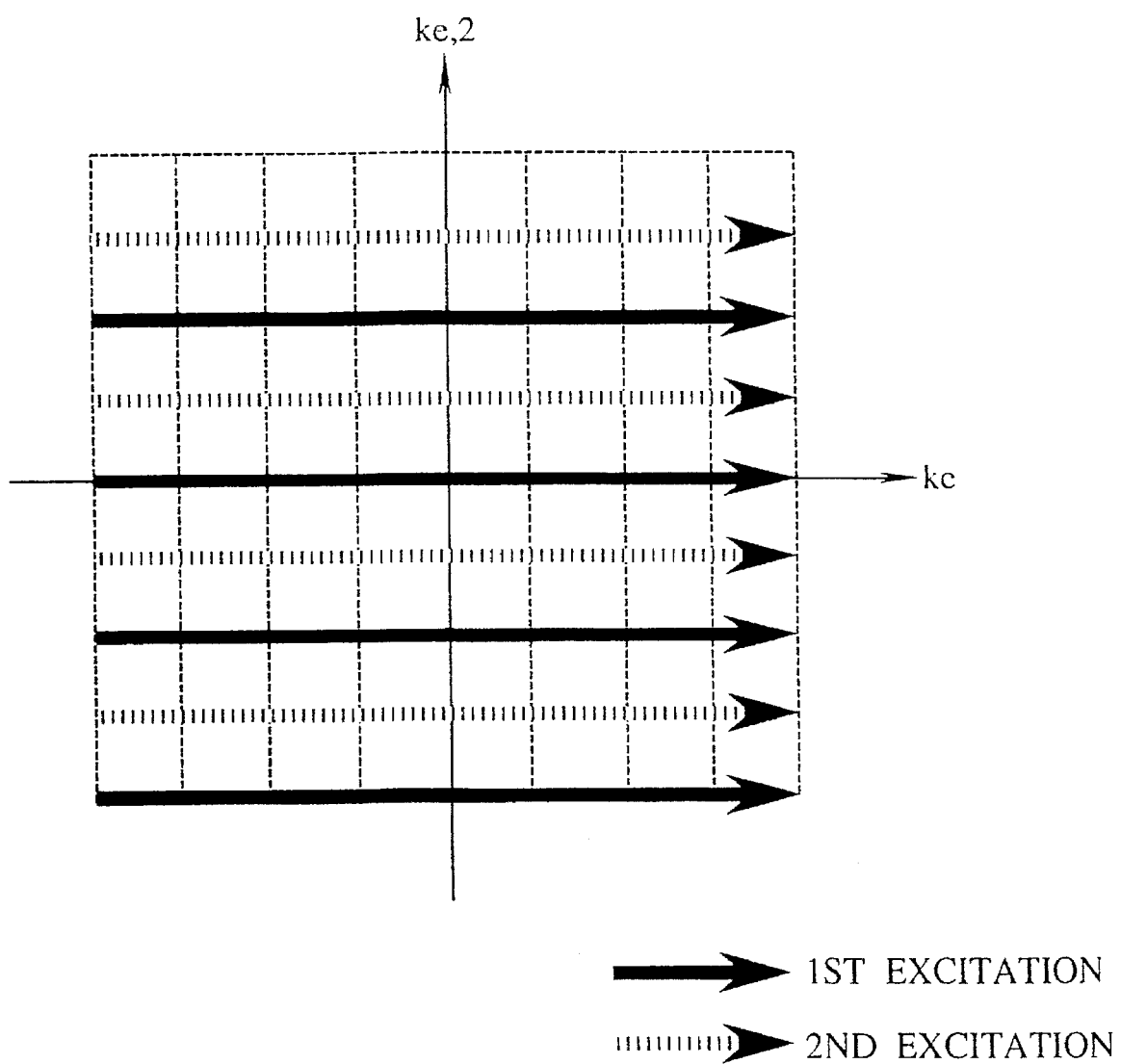
FIG. 15 is a k-space diagram for the second embodiment of FIG. 14.

Next, the second embodiment of the method according to the present invention realizes the pulse sequence as shown in FIG. 14 and the k-trajectory as shown in FIG. 15. This second embodiment is basically similar as the first embodiment of FIG. 11 and FIG. 12, except that the first encoding gradient field pulse $G_e$ for adjusting the phase offset to a prescribed value $-K_e/2$ (where $K_e$ is a k-space size in the first encoding direction) is applied at each phase encoding step for the second encoding gradient field $G_{e,2}$, as indicated in FIG. 14. In other words, the first encoding gradient field pulses $G_e$ are adjusted to a prescribed offset phase without changing theft sign every time the second encoding gradient field pulse $G_{e,2}$ is applied. By means of this, the sampling directions along the first encoding direction become identical regardless of the sampling point in the second encoding direction, as indicated in FIG. 15, so that in principle the N/2 artifact in a plane of the first and second encoding directions disappears. In this second embodiment, a requirement for a performance of the first encoding gradient field $G_e$ is a bit severer than that in the first embodiment, but the other basic imaging performance is substantially the same as in the first embodiment.

Figure 16:
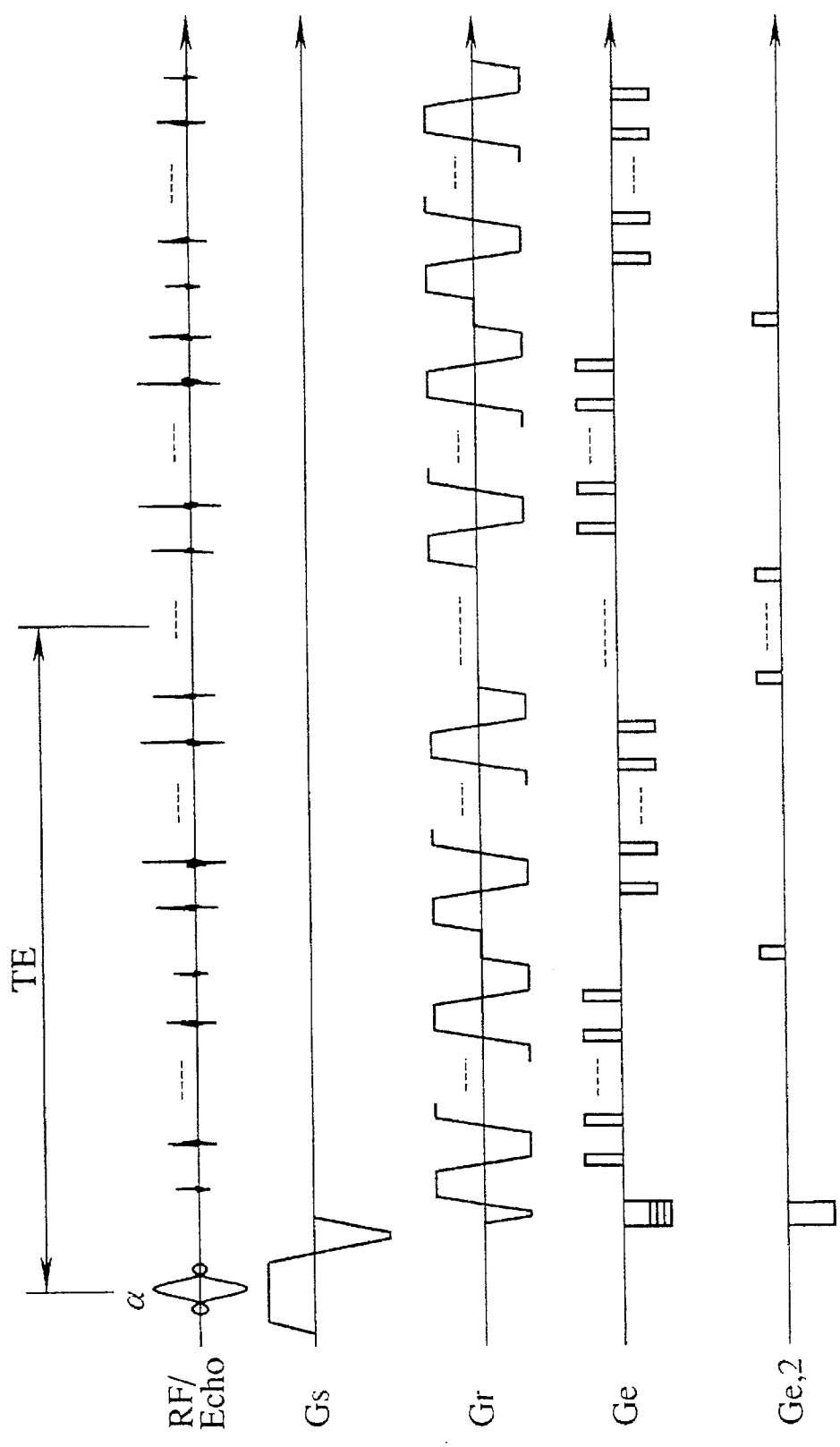
FIG. 16 is a sequence chart for a pulse sequence in a third embodiment of a nuclear magnetic resonance imaging scheme according to the present invention.
Figure 17:
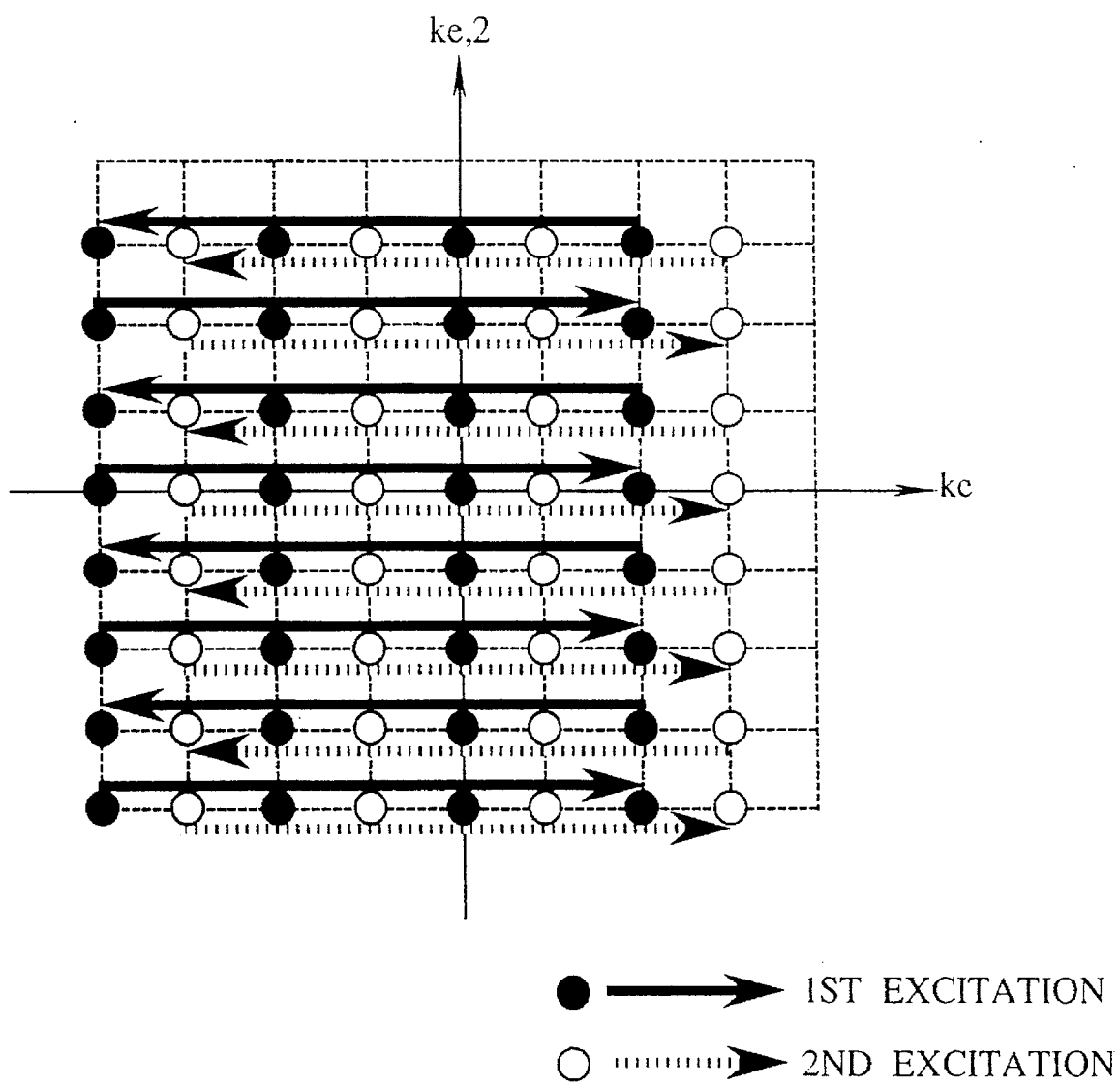
FIG. 17 is a k-space diagram for the third embodiment of FIG. 16.

Next, the third embodiment of the method according to the present invention realizes the pulse sequence as shown in FIG. 16 and the k-trajectory as shown in FIG. 17. This third embodiment differs from the first embodiment of FIG. 11 and FIG. 12 in that, in this third embodiment, all the points on the k-space for the reading direction and the second encoding direction are sampled in each excitation (i.e., a number of divided scans is one), while in the first encoding direction, the data are acquired by the division scans (i.e., a number of divided scans is more than one), by regularly changing an amplitude of the lead-in pulse used at the beginning of the EPI type encoding step in the first encoding gradient field pulse $G_e$ rather than the second encoding gradient field pulse $G_{e,2}$ in each of a plurality of spin excitations. In this pulse sequence of FIG. 16, the sign of the first encoding gradient field pulses $G_e$ is inverted every time the second encoding gradient field pulse $G_{e,2}$ is applied. FIG. 17 shows the k-trajectory in the first and second encoding directions for an exemplary case of using two spin excitations in this third embodiment.

Here, by denoting a number of divided scans in the first encoding direction as $N_{D,e}$, and a k-space size in the first encoding direction as $K_e$, the sampling pitch in the first encoding direction for each excitation can be expressed as $K_e/N_{D,e}$, and the initial position $k_e$ in the first encoding direction for the $n_{D,e}$-th excitation can be set by the following expression (2).

$$k_e = -K_e/2 + (n_{D,e} - 1) \tag{2}$$

As for the image degradation in this third embodiment of FIG. 16 and FIG. 17, the N/2 artifact in a plane of the first and second encoding directions will be caused just as in the first embodiment described above, but it is considered that this N/2 artifact is not much of a problem in view of the considerably large reading gradient field strength used in this third embodiment. On the other hand, in this third embodiment, the number of samplings in the second encoding direction becomes maximum (the number of sampling in the first encoding direction becomes minimum), so that a difference in the signal strength due to the T2 dissipation between the first and second encoding direction sampling data is considerably reduced, and therefore the occurrence of the artifact due to this cause is expected to be suppressed considerably. Also, the image distortion (field inhomogeneity) and the T2 image blurring in the first encoding direction are suppressed to be $1/N_{D,e,2}$ of those in the first embodiment. The other image degradation is considered to be at the same level as in the first embodiment.

Figure 18:
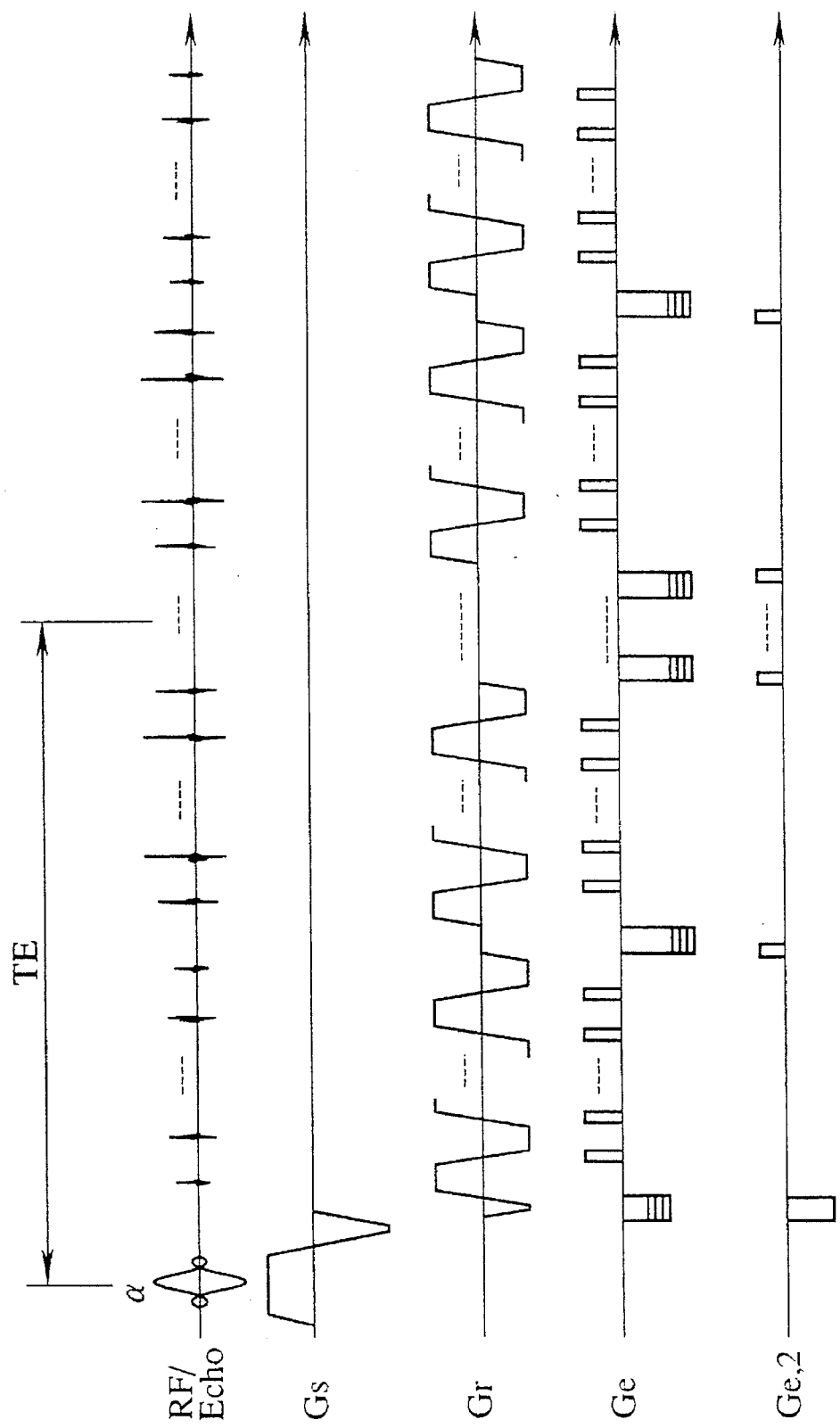
FIG. 18 is a sequence chart for a pulse sequence in a fourth embodiment of a nuclear magnetic resonance imaging scheme according to the present invention.

Next, the fourth embodiment of the method according to the present invention realizes the pulse sequence as shown in FIG. 18 and the k-trajectory as shown in FIG. 19. This fourth embodiment is basically similar as the third embodiment of FIG. 16 and FIG. 17, except that the first encoding gradient field pulse $G_e$ for adjusting the phase offset to a prescribed value is applied at each phase encoding step for the second encoding gradient field $G_{e,2}$, as indicated in FIG. 18. In other words, the first encoding gradient field pulses $G_e$ are adjusted to a prescribed offset phase without changing their sign every time the second encoding gradient field pulse $G_{e,2}$ is applied. Here, the phase offset for the $n_{D,e}$-th excitation is adjusted according to the expression (2) described above. Thus, an amplitude of the first encoding gradient field pulse for adjusting the phase offset is regularly changed in correspondence to the lead-in pulse used at the beginning of the EPI type encoding step in the first encoding gradient field pulse $G_e$. By means of this, the sampling directions along the first encoding direction become identical regardless of the sampling point in the second encoding direction, as indicated in FIG. 19, so that in principle the N/2 artifact in a plane of the first and second encoding directions disappears. In this fourth embodiment, a requirement for a performance of the first encoding gradient field $G_e$ is a bit severer than that in the third embodiment, but the other basic imaging performance is substantially the same as in the third embodiment.

Figure 21A:
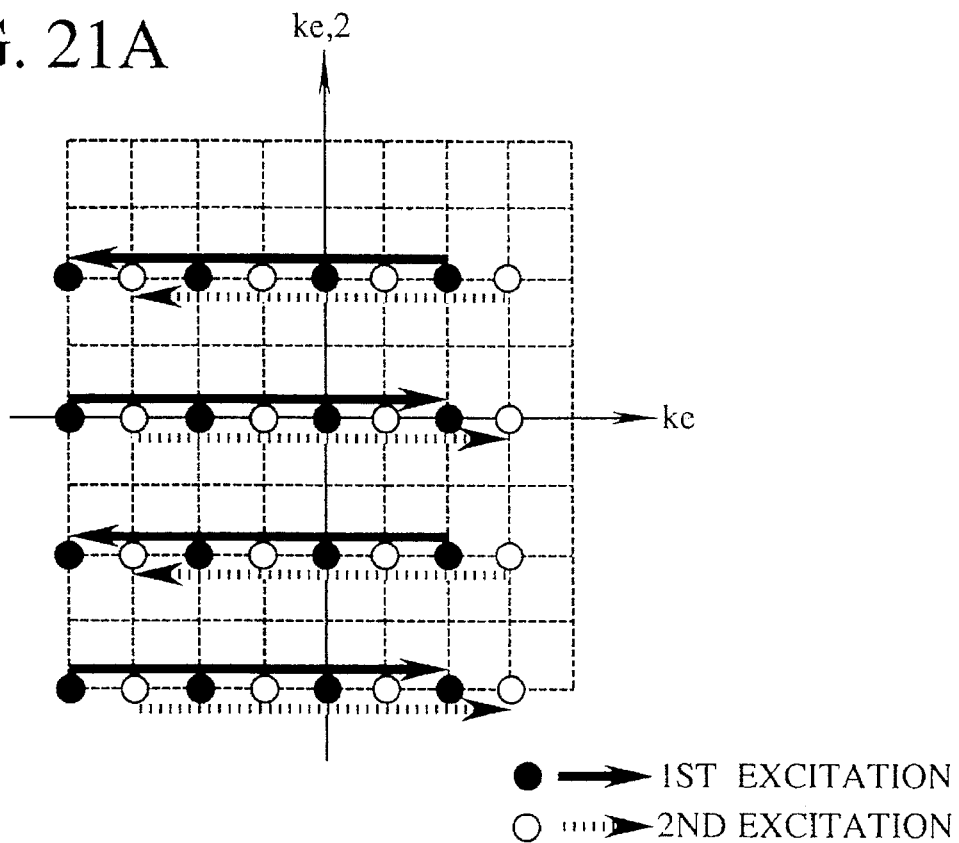
FIGS. 21A and 21B are two possible k-space diagrams for the fifth embodiment of FIG. 20.
Figure 21B:
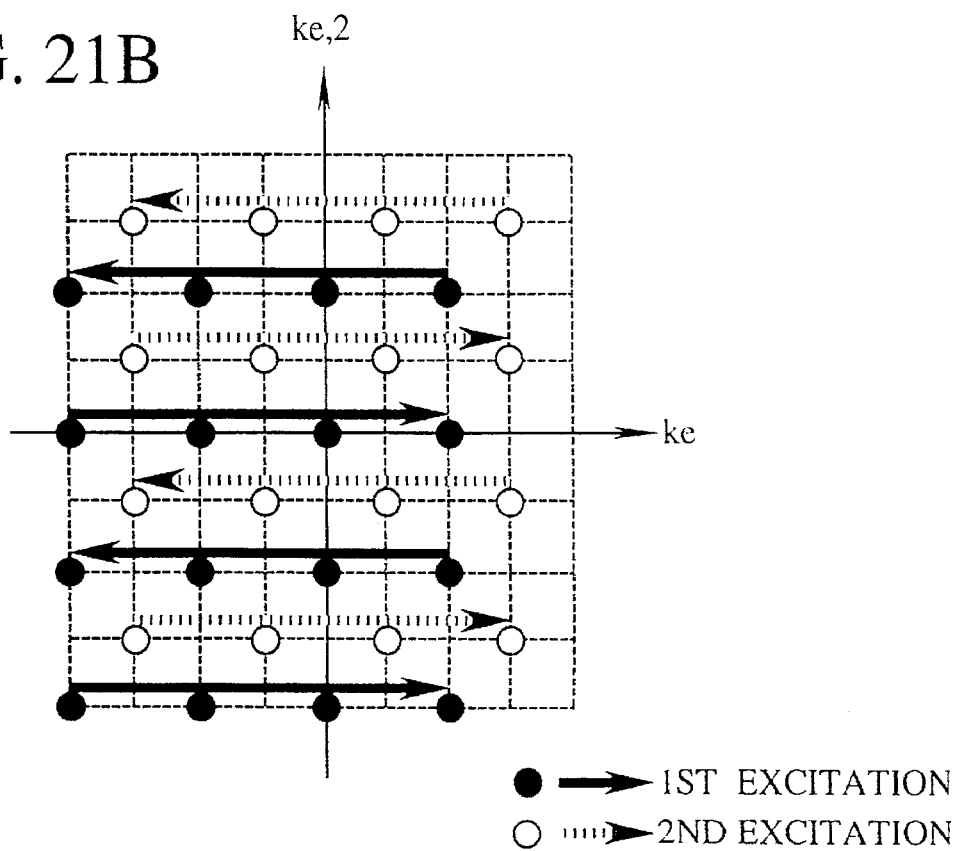

Next, the fifth embodiment of the method according to the present invention realizes the pulse sequence as shown in FIG. 20 and the k-trajectory as shown in FIGS. 21A and 21B. This fifth embodiment differs from the first and third embodiments described above in that, in this fifth embodiment, all the points in the reading direction are sampled in each excitation (i.e. a number of divided scans is one), while both in the first and second encoding directions, the data are acquired by the division scans (i.e., a number of divided scans is more than one), by regularly changing an amplitude of the lead-in pulse used at the beginning of the EPI type encoding step in both the first encoding gradient field pulse $G_e$ and the second encoding gradient field pulse $G_{e,2}$ in each of a plurality of spin excitations. In this pulse sequence of FIG. 20, the sign of the first encoding gradient field pulses $G_e$ is inverted every time the second encoding gradient field pulse $G_{e,2}$ is applied. FIGS. 21A and 21B shows two possible settings of the k-trajectory in the first and second encoding directions for an exemplary case of using two spin excitations in this fifth embodiment.

Here, by denoting numbers of divided scans in the first and second encoding directions as $N_{D,e}$ and $N_{D,e,2}$, and k-space sizes in the first and second encoding directions as $K_e$ and $K_{e,2}$ the sampling pitches in the first and second encoding directions for each excitation can be expressed as $K_e/N_{D,e}$ and $K_{D,e,2}$, and the initial positions $k_e$ and $k_{e,2}$ in the first and second encoding directions for the $n_{D,e}$-th and $n_{D,e,2}$-th excitations can be set by the above described expressions (2) and (1), respectively.

As for the image degradation in this fifth embodiment of FIG. 20 and FIGS. 21A and 21B, the N/2 artifact in a plane of the first and second encoding directions will be caused just as in the first and third embodiments described above, but it is considered that this N/2 artifact is not much of a problem in view of the considerably large reading gradient field strength used in this fifth embodiment. Also, in this fifth embodiment there will be some difference in the signal strength due to the T2 dissipation between the first and second encoding direction sampling data, so that the artifact due to this cause will occur somewhat. The other image degradation is considered to be at the same level as in the first embodiment, except that the channel balance between the first and second encoding directions is superior in this fifth embodiment.

Figure 22:
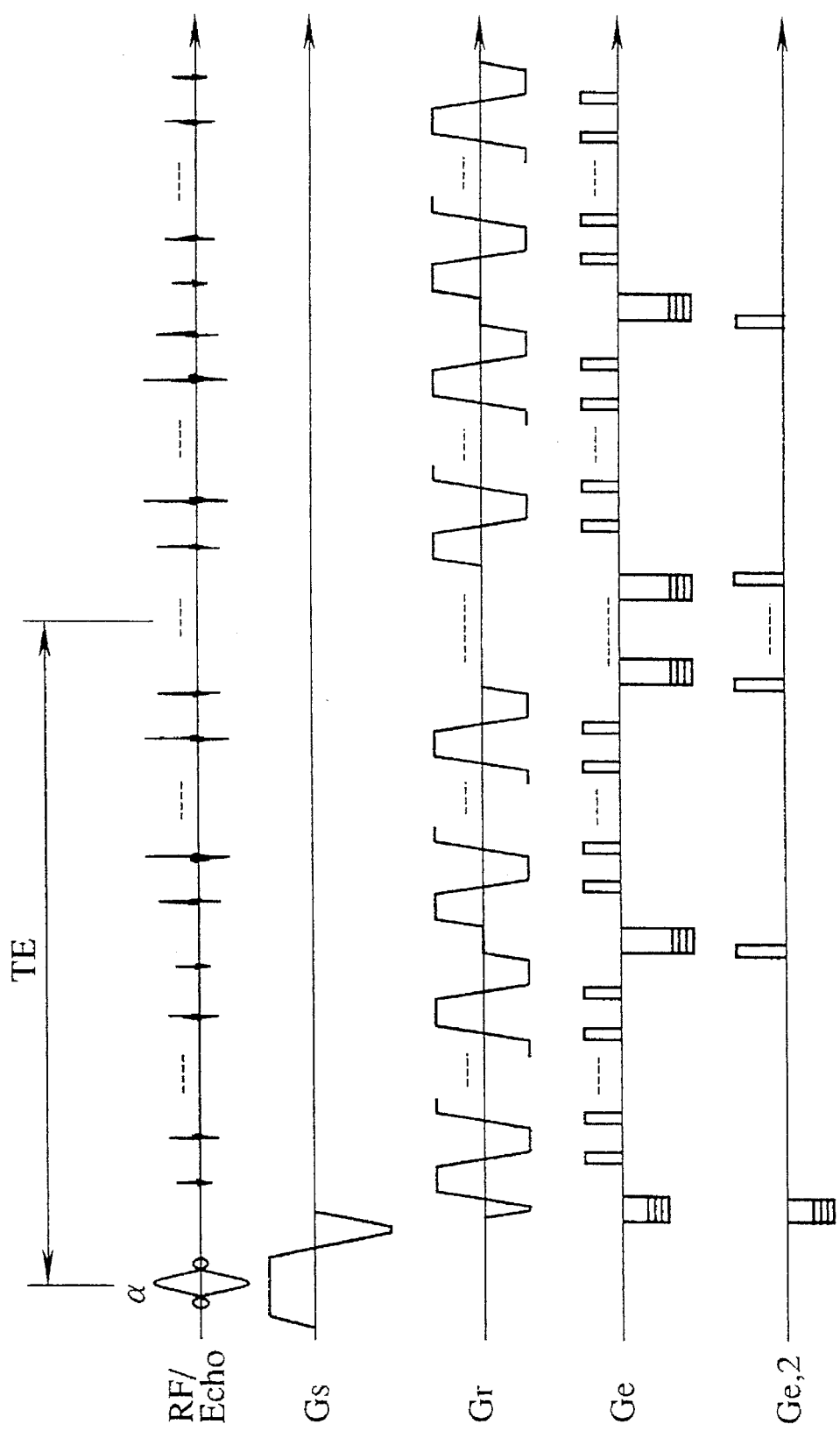
FIG. 22 is a sequence chart for a pulse sequence in a sixth embodiment of a nuclear magnetic resonance imaging scheme according to the present invention.
Figure 23A:
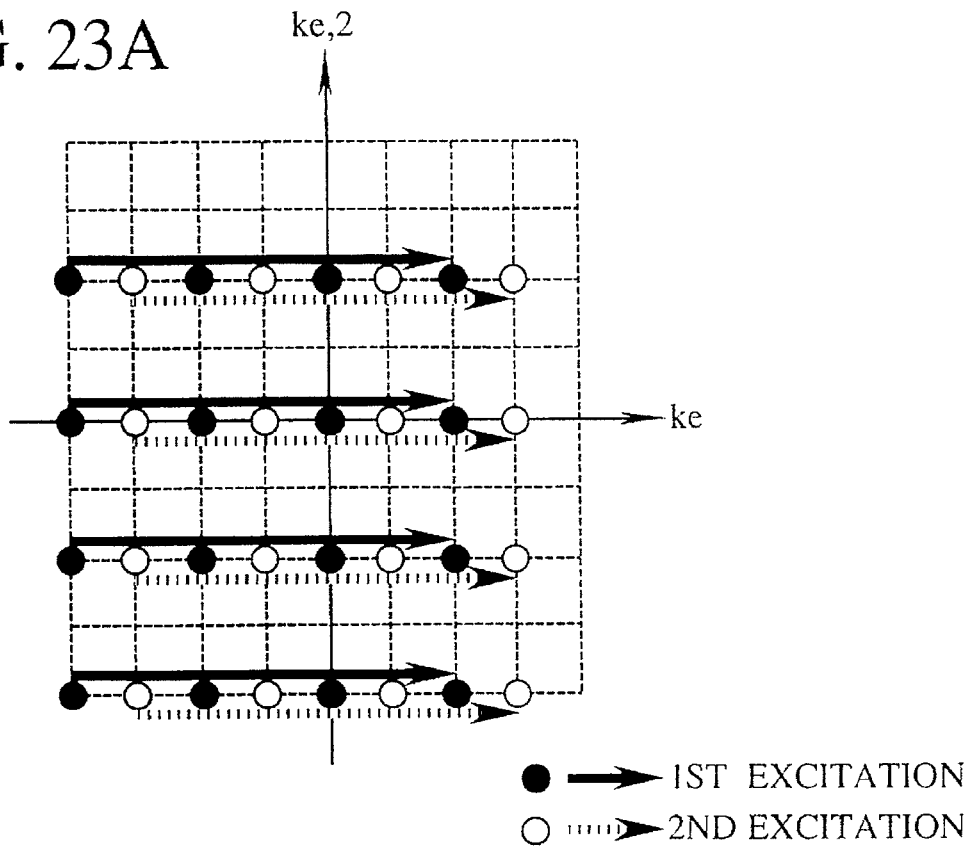
FIGS. 23A and 23B are two possible k-space diagrams for the sixth embodiment of FIG. 22.
Figure 23B:
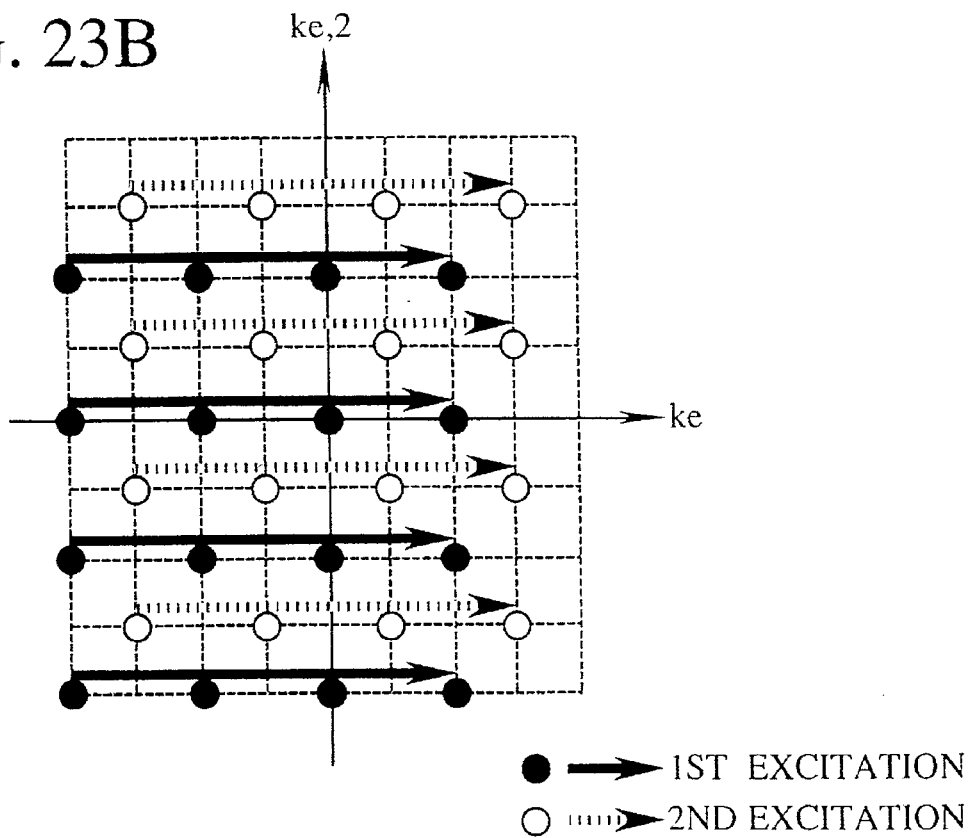

Next, the sixth embodiment of the method according to the present invention realizes the pulse sequence as shown in FIG. 22 and the k-trajectory as shown in FIGS. 23A and 23B. This sixth embodiment is basically similar as the fifth embodiment of FIG. 20 and FIGS. 21A and 21B, except that the first encoding gradient field pulse $G_e$ for adjusting the phase offset to a prescribed value is applied at each phase encoding step for the second encoding gradient field $G_{e,2}$, as indicated in FIG. 22. In other words, the first encoding gradient field pulses $G_e$ are adjusted to a prescribed offset phase without changing their sign every time the second encoding gradient field pulse $G_{e,2}$ is applied. Here, the phase offset for the $n_{D,e}$-th excitation is adjusted according to the expression (21) described above. Thus, an amplitude of the first encoding gradient field pulse for adjusting the phase offset is also regularly changed in correspondence to the lead-in pulse used at the beginning of the EPI type encoding step in the first encoding gradient field pulse $G_e$. By means of this, the sampling directions along the first encoding direction become identical regardless of the sampling point in the second encoding direction, as indicated in FIGS. 23A and 23B, so that in principle the N/2 artifact in a plane of the first and second encoding directions disappears. FIGS. 23A and 23B shows two possible settings of the k-trajectory in the first and second encoding directions for an exemplary case of using two spin excitations in this sixth embodiment. In this sixth embodiment, a requirement for a performance of the first encoding gradient field $G_e$ is a bit severer than that in the fifth embodiment, but the other basic imaging performance is substantially the same as in the fifth embodiment.

Next, the seventh embodiment of the method according to the present invention realizes the pulse sequence as shown in FIG. 24. In this seventh embodiment, the third conventional scheme (EVI scheme) described above is consecutively applied to a number of neighboring regions. Here, each one shot volume region is referred as slab, and its central coordinate in the second encoding direction is denoted as $\hat{X}_{e,2}$. In the pulse sequence of FIG. 24, each slab region having a prescribed thickness in the second encoding direction is selectively excited sequentially, and the received signal $\tilde{S}(k_{e,2})$ for each slab resulting from each excitation is subjected to the correction processing indicated by the following expression (3) before the usual image reconstruction processing is carried out.

$$\tilde{s}(k_{e,2}) => \frac{\hat{s}(k_{e,2})}{\exp[-jk_{e,2}\hat{x}_{e,2}]} \quad (3)$$

In this seventh embodiment, the imaging can be realized in the similar imaging time as in the first to sixth embodiments described above, with even higher image S/N, although there is a possibility for the degradation of the resolution isotropy due to the slice characteristic. The other imaging performance and image degradation are about the same as in the conventional EVI scheme of FIG. 7 and FIG. 8.

Figure 25A:
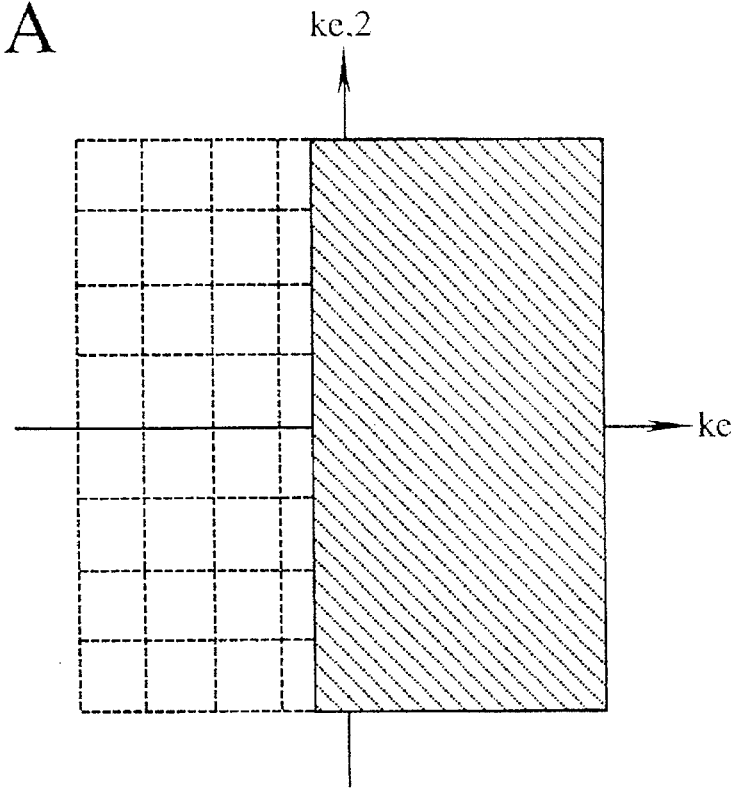
FIGS. 25A and 25B are two possible k-space diagrams for a case of using a half encoding scheme in a nuclear magnetic resonance imaging scheme according to the present invention.
Figure 25B:
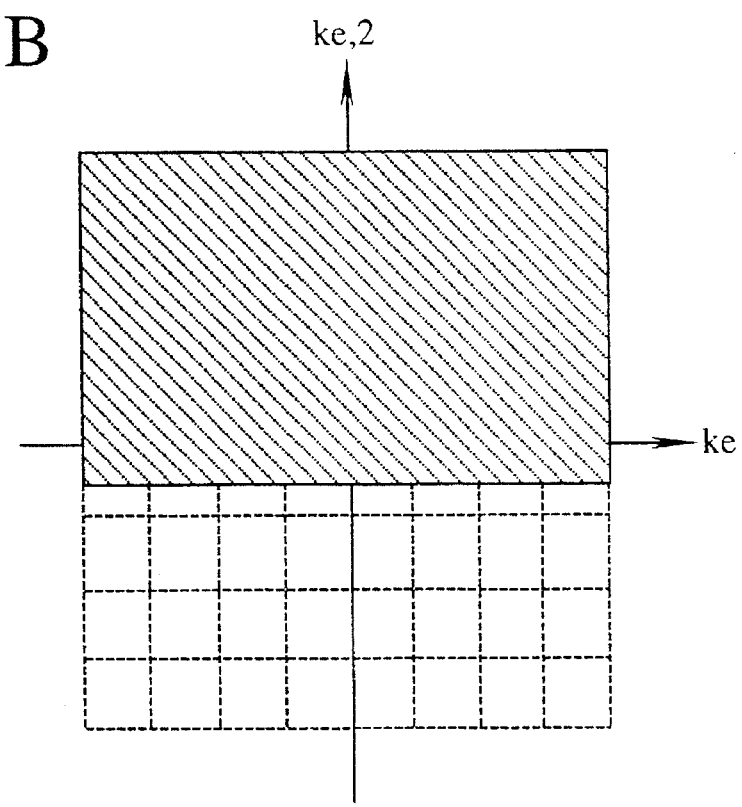

Now, it is possible to apply the so called half encoding scheme (or asymmetrical full encoding scheme) to any of the first to seventh embodiments described above. Here, the half encoding scheme can be applied to the first encoding direction as indicated in FIG. 25A or to the second encoding direction as indicated in FIG. 25B, where shaded region in FIGS. 25A and 25B indicates the actual data acquisition region.

By applying the half encoding scheme, it becomes possible to reduce the imaging time as much as the data acquisition region is reduced. Thus, in a case 4C described above, the imaging time can be reduced to be less than 0.5 sec. As for the data processing required at a time of the image reconstruction in this half encoding scheme, any suitable one of many known processing methods can be used.

It is to be noted that, even though the above description has been directed primarily to the realization of the 3D brain function imaging, the present invention scheme is equally applicable to any other 3D (multi-dimensional) imaging such as Fast SE scheme, Grase scheme, SE based EPI scheme, high speed chemical shift imaging, and any scheme using 180° pulse, etc.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for nuclear magnetic resonance imaging, comprising:

imaging means for imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and control means for controlling the pulse sequence to realize a three dimensional imaging sequence with first encoding gradient field pulses and second encoding gradient field pulses for defining regular sampling pitches in first and second encoding directions, where at least one of the first encoding gradient field pulses and the second encoding gradient field pulses has a lead-in pulse in regularly changing magnitude for each spin excitation.

2. The apparatus of claim 1, wherein the control means controls the pulse sequence such that a sign of the first encoding gradient field pulses is inverted at each encoding step for the second encoding gradient field pulses.

3. The apparatus of claim 1, wherein the control means controls the pulse sequence such that the first encoding gradient field pulses is adjusted to a prescribed offset phase without changing a sign of the first encoding gradient field pulses at each encoding step for the second encoding gradient field pulses.

4. The apparatus of claim 1, wherein the control means controls the pulse sequence to realize the three dimensional imaging sequence such that both the first encoding gradient field pulses and the second encoding gradient field pulses have lead-in pulses in regularly changing magnitudes for each spin excitation.

5. The apparatus of claim 1, wherein the control means controls the pulse sequence to realize the three dimensional imaging sequence in a half encoding scheme for at least one of the first encoding direction and the second encoding direction.

6. The apparatus of claim 1, wherein
    the control means controls the pulse sequence to realize the three dimensional imaging sequence with a division scan in at least one of the first and second encoding directions.

7. The apparatus of claim 6, wherein the control means controls the pulse sequence such that a sampling direction in the first encoding direction is reversed at each encoding step in the second encoding direction.

8. The apparatus of claim 6, wherein the control means controls the pulse sequence such that a sampling direction in the first encoding direction is adjusted to be identical at each encoding step in the second encoding direction.

9. The apparatus of claim 6, wherein the control means controls the pulse sequence to realize the three dimensional imaging sequence with division scans in both the first encoding direction and the second encoding direction.

10. The apparatus of claim 6, wherein the control means controls the pulse sequence to realize the three dimensional imaging sequence in a half encoding scheme for at least one of the first encoding direction and the second encoding direction.

11. A method of nuclear magnetic resonance imaging, comprising the steps of:

imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; and controlling the pulse sequence to realizing a three dimensional imaging sequence with first encoding gradient field pulses and second encoding gradient field pulses for defining regular sampling pitches in first and second encoding directions, where at least one of the first encoding gradient field pulses and the second encoding gradient field pulses has a lead-in pulse in regularly changing magnitude for each spin excitation.

12. The method of claim 11, wherein the controlling step controls the pulse sequence such that a sign of the first encoding gradient field pulses is inverted at each encoding step for the second encoding gradient field pulses.

13. The method of claim 11, wherein the controlling step controls the pulse sequence such that the first encoding gradient field pulses is adjusted to a prescribed offset phase without changing a sign of the first encoding gradient field pulses at each encoding step for the second encoding gradient field pulses.

14. The method of claim 11, wherein the controlling step controls the pulse sequence to realize the three dimensional imaging sequence such that both the first encoding gradient field pulses and the second encoding gradient field pulses have lead-in pulses in regularly changing magnitudes for each spin excitation.

15. The method of claim 11, wherein the controlling step controls the pulse sequence to realize the three dimensional imaging sequence in a half encoding scheme for at least one of the first encoding direction and the second encoding direction.

16. The method of claim 11, wherein the controlling step controls the pulse sequence to realize the three dimensional imaging sequence with a division scan in at least one of the first and second encoding directions.

17. The method of claim 16, wherein the controlling step controls the pulse sequence such that a sampling direction in the first encoding direction is reversed at each encoding step in the second encoding direction.

18. The method of claim 16, wherein the controlling step controls the pulse sequence such that a sampling direction in the first encoding direction is adjusted to be identical at each encoding step in the second encoding direction.

19. The method of claim 16, wherein the controlling step controls the pulse sequence to realize the three dimensional imaging sequence with division scans in both the first encoding direction and the second encoding direction.

20. The method of claim 16, wherein the controlling step controls the pulse sequence to realize the three dimensional imaging sequence in a half encoding scheme for at least one of the first encoding direction and the second encoding direction.

* * * * *